(12) United States Patent
Mogi et al.

(10) Patent No.: US 7,439,884 B2
(45) Date of Patent: Oct. 21, 2008

(54) SAMPLING RATE CONVERSION DEVICE AND METHOD, AND AUDIO DEVICE

(75) Inventors: Yukihiko Mogi, Kanagawa (JP); Homare Nishizaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/550,288

(22) PCT Filed: Jan. 18, 2005

(86) PCT No.: PCT/JP2005/000515
§ 371 (c)(1),
(2), (4) Date: Nov. 14, 2006

(87) PCT Pub. No.: WO2005/074131
PCT Pub. Date: Aug. 11, 2005

(65) Prior Publication Data
US 2007/0041438 A1    Feb. 22, 2007

(30) Foreign Application Priority Data
Jan. 30, 2004    (JP) .............................. 2004-022777

(51) Int. Cl.
*H03M 7/00*    (2006.01)
(52) U.S. Cl. ........................ 341/61; 341/155; 341/118; 341/119
(58) Field of Classification Search ................ 341/61, 341/118, 119, 155
See application file for complete search history.

(56) References Cited

U.S. PATENT DOCUMENTS

| | | | |
|---|---|---|---|
| 5,568,142 A | | 10/1996 | Velazquez et al. |
| 6,061,410 A | * | 5/2000 | Linz .......................... 375/371 |
| 6,462,682 B2 | * | 10/2002 | Hellberg ...................... 341/61 |
| 6,542,094 B1 | * | 4/2003 | Venkitachalam et al. ...... 341/61 |
| 2002/0191709 A1 | * | 12/2002 | Hunton ....................... 375/295 |
| 2003/0016306 A1 | * | 1/2003 | Ogata et al. ................. 348/671 |
| 2003/0161486 A1 | * | 8/2003 | Wu et al. .................... 381/94.4 |

FOREIGN PATENT DOCUMENTS

| | | |
|---|---|---|
| JP | 5-327409 | 12/1993 |
| JP | 6-120776 | 4/1994 |

(Continued)

*Primary Examiner*—Jean B Jeanglaude
(74) *Attorney, Agent, or Firm*—Oblon, Spivak, McClelland, Maier & Neustadt, P.C.

(57) ABSTRACT

A sampling rate converter able to obtain an amplitude characteristic that passes any frequency and able to achieve a high precision conversion without depending upon a cutoff frequency, having an up sampler 103 for inserting (U-1) zero points between signals and raising a sampling frequency Fsi U-fold, a convolution processing unit 104 including an FIR filter and interpolating a value by convolution with respect to output signals of the up sampler, and a linear interpolation block 105 for selecting two points of samples from the output signal of the convolution processing unit 104 having a sampling frequency UFsi and finding the value at a required position from the linear interpolation, wherein the FIR filter has an impulse response becoming a filter coefficient, having a transmission function $H(z)$ associated with a transmission function $Z(z)$ of a pre-filter, and having a filter coefficient set by performing weighted approximation with respect to a desired characteristic associated with the frequency response of the pre-filter.

57 Claims, 22 Drawing Sheets

FOREIGN PATENT DOCUMENTS

| | | |
|---|---|---|
| JP | 6-204797 | 7/1994 |
| JP | 7-221598 | 8/1995 |
| JP | 10-507891 | 7/1998 |
| JP | 2002-9591 | 1/2002 |
| JP | 2002-9592 | 1/2002 |
| JP | 2002-368543 | 12/2002 |

* cited by examiner

SELECT ADJOINING 2 POINTS AND LINEAR INTERPOLATE $Y = \beta * \ln A + \alpha * \ln B$

LINEAR INTERPOLATION

FIG. 8A
CASE 1: ODD NUMBER TAPS,
EVEN SYMMETRIC,
CENTER OF SYMMETRY
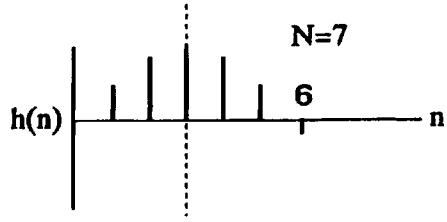
FIG. 8B
CASE 2: EVEN NUMBER TAPS,
EVEN SYMMETRIC,
CENTER OF SYMMETRY
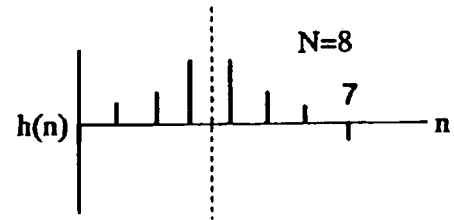
FIG. 8C
CASE 3: ODD NUMBER TAPS,
ODD SYMMETRIC,
CENTER OF SYMMETRY
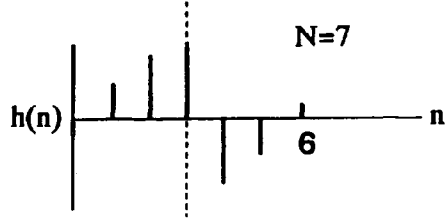
FIG. 8D
CASE 4: ODD NUMBER TAPS,
ODD SYMMETRIC,
CENTER OF SYMMETRY
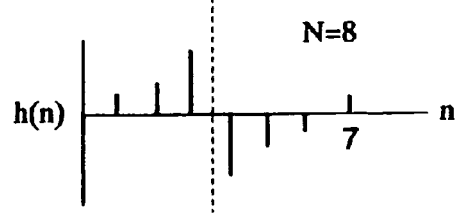
FIG. 9
| CASE | $Q(e^{j\omega})$ | R |
|---|---|---|
| 1 | 1 | $(L-1)/2+1-2 \times N_p$ |
| 2 | $\cos(\omega/2)$ | $L/2-1+1-2 \times N_p$ |
| 3 | $\sin(\omega)$ | $(L-3)/2+1-2 \times N_p$ |
| 4 | $\sin(\omega/2)$ | $L/2-1+1-2 \times N_p$ |

FIG. 19

| VARIABLE | TYPE | EXPLANATION |
|---|---|---|
| MasterCount | int | DETERMINE OPERATION OF LINEAR INTERPOLATION |
| Count1000 | int | COUNTER OF DECIMAL POINT OR LESS TO BE ADDED TO MASTER COUNTER |
| CountAdd | int | ADDED VALUE OF INTEGER PORTION TO BE ADDED TO MASTER COUNTER |
| CountAmari | int | ADDED VALUE OF REMAINDERS OF DECIMAL POINT OR LESS TO BE ADDED TO COUNT1000 |

FIG. 20A

| BIT | EXPLANATION |
|---|---|
| [15:0] | COEFFICIENT $\alpha$ VALUE OF LINEAR INTERPOLATION |
| [22:16] | NUMBERS OF POLY-PHASE COEFFICIENT SET |
| [25:23] | SAMPLE NUMBERS TO BE READ AND FETCHED |

FIG. 20B

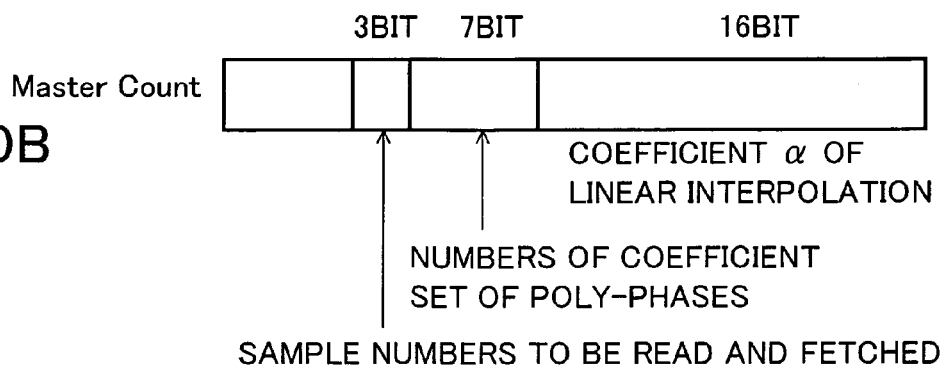

SAMPLING RATE CONVERSION DEVICE AND METHOD, AND AUDIO DEVICE

TECHNICAL FIELD

The present invention relates to a sampling rate converter which can be applied to for example conversion of a sampling frequency of audio and conversion of resolution for magnification or reduction of a frame of an image and a method of the same and audio apparatus.

BACKGROUND ART

In digital signal processing of audio and images, filter processing is frequently used. As the filter used for the filter processing, due to the feature that a linear phase is obtained with a finite number of taps, a linear phase FIR (Finite Impulse Response) filter is frequently utilized.

FIG. 1 is a diagram showing the configuration of a transversal type circuit of the linear phase FIR filter.

This linear phase FIR filter 1 has, as shown in FIG. 1, (n-1) number of delay units 2-1 to 2-n-1 cascade connected with respect to an input terminal TIN and configuring a shift register, n number of multipliers 3-1 to 3-n for multiplying filter coefficients h(0) to h(n-1) with respect to the signal input to the input terminal TIN and output signals of the delay units 2-1 to 2-n-1, and an adder 4 for adding the output signals of the n number multipliers 3-1 to 3-n and outputting the result to an output terminal TOUT.

As a representative design method of such a linear phase FIR filter, for example a Remez Exchange algorithm applied to a linear phase FIR filter by Parks, T. W. and McClellan, J. H. et al. is known (refer to for example Non-Patent Document 1).

The Remez Exchange algorithm is an algorithm for approximation so that a weighted approximation error exhibits an equal ripple shape with respect to a desired amplitude characteristic.

As applications of filter processing using a linear phase FIR filter, there are conversion of resolution of an image utilizing sampling rate conversion and conversion of the sampling frequency of audio.

For example, in conversion of resolution, use is made of a multi-rate filter using an interpolator, a decimeter, and a linear phase FIR filter as element technologies (refer to for example Non-Patent Document 2).

In a multi-rate filter, generally the linear phase FIR filter is used poly-phase decomposed matching with the interpolator. Both of the interpolator and the decimeter are cyclical time-invariant systems and have characteristic features different from that of a time-invariant system.

Due to the cyclical time invariability of the interpolator, distortion on a lattice called as "chessboard distortion" occurs in the conversion of resolution of the image.

Therefore, Harada and Takaie considered conditions for avoiding the chessboard distortion from a zero point arrangement of the filter (refer to Non-Patent Document 3).

A transmission function H(z) of the multi-rate filter not accompanied by chessboard distortion is found by multiplying a transmission function K(z) of the linear phase FIR filter (hereinafter referred to as an equalizer) designed by some sort of method by a zero point transmission function Z(z) in order to avoid the chessboard distortion later.

(Equation 1)
$$H(z) = Z(z) \cdot K(z) \quad (1)$$

(Equation 2)
$$Z(z) = 1 + z^{-1} + z^{-2} + \ldots + z^{-(U-1)} \quad (2)$$

Here, a previously fixed linear phase FIR filter like the zero point transmission function Z(z) for avoiding the chessboard distortion will be referred to as a pre-filter.

FIGS. 2A to 2C show an example of the frequency response of a multi-rate filter avoiding chessboard distortion by multiplying the equalizer designed by the Remez Exchange algorithm by a pre-filter and the weighted approximation error.

Non-Patent Document 1: Parks, T. W. and McClellan, J. H.: "Chebyshev Approximation for Nonrecursive Digital Filters with Linear Phase", IEEE Trans. Circuit Theory, CT-19, 2, pp. 189-194, 1972, and Rabiner, L. R., McClellan, J. H. and Parks, T. W.: "FIR Digital Filter Design Techniques Using Weighted Chebyshev Approximation", Proc. IEEE, Vol. 63, April, pp. 595-610, 1975;

Non-Patent Document 2: Takaie, Hitoshi, Multi-rate Signal Processing, Shokodo, 1997;

Non-Patent Document 3: Harada, Yasuhiro and Takaie, Hitoshi: Multi-rate Filter not Accompanied by Chessboard Distortion and Zero Point Arrangement of Same, Shingaku Giho CAS96-78, pp. 1-6, 1997-01

DISCLOSURE OF THE INVENTION

Problem to be Solved by the Invention

However, methods for avoiding chessboard distortion by the above-described methods has the following disadvantages.

Namely, in a multi-rate filter having a transmission function H(z) designed by the conventional method, as shown in FIG. 2C, the equal ripple of the weighted approximation error designed by the Remez Exchange algorithm collapses.

Further, in the multi-rate filter designed by the conventional method, as shown in FIG. 2B, the pass band gain is not a constant value, but the right end attenuates.

When conversion of resolution is carried out by using such a filter, the contours of an image become vague and influences the image quality. In the same way, when conversion of the sampling frequency is carried out by using such a filter, a high frequency component attenuates and high precision audio reproduction cannot be carried out.

Attenuation at the pass band cannot be avoided even when the filter coefficient is increased.

Further, there is a case where a DC gain must be set at 1 when the frequency w is 0 in the design specifications of a linear phase FIR filter.

However, in a Remez Exchange algorithm, as shown in FIGS. 3A to 3C, an amplitude characteristic that passes any designated frequency point cannot be obtained.

Further, FIG. 4 shows an example of the configuration of a sampling rate conversion unit based on the theory of conventional multi-rate signal processing.

A sampling rate conversion unit 10 of FIG. 4 has an up sampler 11, FIR filter 12, and down sampler 13.

Further, in FIG. 4, "U" and "D" are positive indicates the transmission function of the FIR filter. Further, an upward arrow indicates the up sampler for inserting (U-1) zero points between signals, and a downward arrow indicates the down sampler for thinning inserting (U-1) zero points between signals, and a The sampling rate conversion unit 10 of FIG. 4 raises the sampling rate of the signal U-fold by the up sampler 11, performs band restriction by using the FIR filter 12, and finally performs an operation lowering the sampling rate to 1/D by the down sampler 13.

By this, the sampling rate can be converted to U/D times. The cutoff frequency of this FIR filter becomes as follows.

(Equation 3)

$$\omega C = \pi / \max U, D \qquad 3)$$

For example, in order to accomplish sampling rate conversion from 44.1 kHz or up to 44.1 kHz based on the theory of the conventional multi-rate signal processing as shown in FIG. 4, a filter in which the cutoff frequency of the FIR filter 2 of the low pass filter is extremely strict must be prepared.

In general, as shown below, such a filter needs a large number of taps and is extremely difficult to realize.

From 44.1 kHz to 48 kHz,
Up=160, Down=147, and
Cutoff frequency $\pi/160$.
From 44.1 kHz to 32 kHz,
Up=320, Down=441, and
Cutoff frequency $\pi/441$.
From 44.1 kHz to 24 kHz,
Up=80, Down=147, and
Cutoff frequency $\pi/147$.
From 48 kHz to 44.1 kHz,
Up=147, Down=160, and
Cutoff frequency $\pi/160$.
From 32 kHz to 44.1 kHz,
Up=441, Down=320, and
Cutoff frequency $\pi/441$.
From 24 kHz to 44.1 kHz,
Up=147, Down=80, and
Cutoff frequency $\pi/147$.

The present invention was made in consideration with such a circumstance and has an object thereof to provide a sampling rate converter in which the equal ripple of the weighted approximation error does not collapse, the gain of the pass band can be held at substantially a constant value, an amplitude characteristic that passes any frequency can be obtained, and high precision conversion can be accomplished and a method of the same and an audio apparatus.

Means for Solving the Subject

To attain the above object, a sampling rate converter according to a first aspect of the present invention has an up sampler for inserting U-1 zero points between sample signals and raising a sampling frequency U-fold, a convolution processing unit including an FIR filter and performing predetermined convolution processing with respect to an output signal of the up sampler, and a linear interpolation block for selecting two points of samples with respect to the results of processing of the convolution processing unit and finding a value at a required position from the linear interpolation, wherein the FIR filter of the convolution processing unit is an FIR filter where an impulse response is expressed by a finite time length, the impulse response becomes a filter coefficient, and a transmission function H(z) is associated with a transmission function Z(z) of a pre-filter, and the filter coefficient is set by performing weighted approximation with respect to a desired characteristic in relation to a frequency to be passed and/or a frequency response of the pre-filter.

A sampling rate converter according to a second aspect of the present invention has a plurality of convolution processing units including pre-phase filters obtained by poly-phase decomposing a predetermined FIR filter and performing the convolution processing of input sample signals and the poly-phase filters decomposed to the poly-phases, a plurality of up samplers for inserting U-1 zero points between output signals of corresponding convolution processing units and raising the sampling frequency U-fold, an adding means for generating a signal after adding all signals by adjusting a propagation time of output signals of the plurality of up samplers, and a linear interpolation block for selecting two points of samples with respect to the signal by the adding means and finding the value at the required position from the linear interpolation, wherein the FIR filter is an FIR filter where an impulse response is expressed by a finite time length, the impulse response becomes the filter coefficient, and a transmission function H(z) is associated with a transmission function Z(z) of a pre-filter, and the filter coefficient is set by performing weighted approximation with respect to a desired characteristic in relation to a frequency to be passed and/or a frequency response of the pre-filter.

A sampling rate converter according to a third aspect of the present invention has a convolution processing unit including poly-phase filters able to set different filter coefficients obtained by poly-phase decomposing a predetermined FIR filter and performing convolution processing of input sample signals and a poly-phase filter having a selected coefficient, a selector for selecting two points of samples required for an output sample and selecting the coefficient of the corresponding poly-phase filter, and a linear interpolation block for finding the value at the required position from linear interpolation, wherein the FIR filter is an FIR filter where an impulse response is expressed by a finite time length, the impulse response becomes the filter coefficient, and a transmission function H(z) is associated with a transmission function Z(z) of a pre-filter, and the filter coefficient is set by performing weighted approximation with respect to a desired characteristic in relation to a frequency to be passed and/or a frequency response of the pre-filter.

A sampling rate conversion method according to a fourth aspect of the present invention comprising a first step of inserting U-1 zero points between sample signals and raising the sampling frequency U-fold, a second step of performing predetermined convolution processing with respect to a signal multiplied in its sampling frequency by U by a convolution processing unit including an FIR filter in which an impulse response is expressed by a finite time length, an impulse response becomes the filter coefficient, and a transmission function H(z) is associated with a transmission function Z(z) of a pre-filter, and a third step of selecting two points of samples with respect to the results of processing and finding the value at the required position from linear interpolation, wherein the filter coefficient of the FIR filter is calculated by performing weighted approximation with respect to a desired characteristic in relation to a frequency to be passed and/or a frequency response of the pre-filter.

A sampling rate conversion method according to a fifth aspect of the present invention comprising a first step of performing convolution processing of input sample signals and poly-phase filters decomposed to poly-phases by a plurality of convolution processing units including poly-phase filters obtained by poly-phase decomposing a predetermined FIR filter, a second step of inserting U-1 zero points between output signals of corresponding convolution processing units and raising the sampling frequency U-fold, a third step of adjusting the propagation time of a plurality of signals having sampling frequencies raised U-fold and generating a signal obtained by adding all signals, and a fourth step of selecting two points of samples with respect to the signal by the third step and finding the value at the required position from the linear interpolation, wherein the FIR filter is a FIR filter where an impulse response is expressed by a finite time length, the impulse response becomes the filter coefficient, and a transmission function H(z) is associated with a transmission function Z(z) of a pre-filter, and the filter coefficient is calculated by performing weighted approximation with respect to a desired characteristic in relation to a frequency to be passed and/or a frequency response of the pre-filter.

A sampling rate conversion method according to a sixth aspect of the present invention comprises a first step of selecting two points of samples required for an output sample and selecting a coefficient of a corresponding poly-phase filter and a second step of performing convolution processing of input sample signals and the poly-phase filter having the selected coefficient by a convolution processing unit including poly-phase filters obtained by poly-phase decomposing a predetermined FIR filter and able to set different filter coefficients, wherein the FIR filter is a FIR filter where an impulse response is expressed by a finite time length, the impulse response becomes the filter coefficient, and a transmission function H(z) is associated with a transmission function Z(z) of a pre-filter, and the filter coefficient is calculated by performing the weighted approximation with respect to a desired characteristic in relation to a frequency to be passed and/or a frequency response of the pre-filter.

A seventh aspect of the present invention is an audio apparatus U-1 including a sampling rate converter, wherein the sampling rate converter has an up sampler for inserting U-1 zero points between sample signals and raising a sampling frequency U-fold, a convolution processing unit including an FIR filter and performing predetermined convolution processing with respect to an output signal of the up sampler, and a linear interpolation block for selecting two points of samples with respect to the results of processing of the convolution processing unit and finding a value at a required position from linear interpolation, wherein the FIR filter of the convolution processing unit is an FIR filter where an impulse response is expressed by a finite time length, the impulse response becomes the filter coefficient, and a transmission function H(z) is associated with a transmission function Z(z) of a pre-filter, and the filter coefficient is set by performing weighted approximation with respect to a desired characteristic in relation to a frequency to be passed and/or a frequency response of the pre-filter.

An eighth aspect of the present invention is an audio apparatus including a sampling rate converter, wherein the sampling rate converter has a plurality of convolution processing units including pre-phase filters obtained by poly-phase decomposing a predetermined FIR filter and performing convolution processing of input sample signals and poly-phase filters decomposed to poly-phases, a plurality of up samplers for inserting U-1 zero points between output signals of corresponding convolution processing units and raising the sampling frequency U-fold, an adding means for generating a signal after adding all signals by adjusting a propagation time of output signals of the plurality of up samplers, and a linear interpolation block for selecting two points of samples with respect to the signal by the adding means and finding the value at the required position from linear interpolation, wherein the FIR filter is an FIR filter where an impulse response is expressed by a finite time length, an impulse response becomes the filter coefficient, and a transmission function H(z) is associated with a transmission function Z(z) of a pre-filter, and the filter coefficient is set by performing the weighted approximation with respect to a desired characteristic in relation to a frequency to be passed and/or a frequency response of the pre-filter.

A ninth aspect of the present invention is an audio apparatus including a sampling rate converter, wherein the sampling rate converter has a convolution processing unit including poly-phase filters able to set different filter coefficients obtained by poly-phase decomposing a predetermined FIR filter and performing convolution processing of input sample signals and a poly-phase filter having a selected coefficient, a selector for selecting two points of samples required for an output sample and selecting the coefficient of the corresponding poly-phase filter, and a linear interpolation block for finding the value at the required position from linear interpolation, wherein the FIR filter is an FIR filter where an impulse response is expressed by a finite time length, the impulse response becomes the filter coefficient, and a transmission function H(z) is related to a transmission function Z(z) of a pre-filter, and the filter coefficient is set by performing weighted approximation with respect to a desired characteristic in relation to a frequency to be passed and/or a frequency response of the pre-filter.

According to the present invention, for example a FIR filter is designed. For example, by an initial setup, a linear phase FIR filter is set, a band is set, a coefficient of the pre-filter is set, any frequency point to be passed is input, and an initial extreme point is set.

Next, an interpolation polynomial for interpolating the amplitude characteristic from a present extreme point and a frequency point to be passed is generated.

Next, a new extreme point is determined from the amplitude characteristic found from the generated interpolation polynomial.

These are repeated and it is judged whether or not for example the position of the extreme is approximated within a desired range.

Then, the filter characteristic is found from the approximated amplitude characteristic.

In this way, in an FIR filter having the coefficient set therein, the weighted approximation error becomes an equal ripple, and the gain at the pass band is held at a constant value.

Further, a designated frequency point can be passed.

Then, the up sampler raises the sampling frequency U-fold by inserting U−1 zero points between sample signals.

Next, predetermined convolution processing is carried out with respect to the signal multiplied in its sampling frequency by U by the convolution processing unit including the FIR filter designed as described above.

Next, it selects two points of samples with respect to the results of processing of the convolution processing unit and finds the value at the required position from linear interpolation.

EFFECT OF THE INVENTION

According to the present invention, sampling rate conversion having a strict cutoff frequency is possible.

Further, it is possible to avoid chessboard distortion.

Further, any pre-filter can be considered, and it is possible to pass any frequency point.

Further, it is possible to suppress the amount of processing to a required lowest limit, and an improvement of a processing speed can be achieved.

BRIEF DESCRIPTION OF THE DRAWINGS

FIGS. 8A to 8D are views showing impulse responses in four cases where the FIR filter has a linear phase.

FIG. 9 is a view showing $Q(e^{j\omega})$ and R with respect to four cases of the linear phase FIR filter.

FIG. 19 is a view for explaining a variable used in the linear interpolation block.

FIGS. 10A and 20B are views for specifically explaining MasterCount.

DESCRIPTION OF NOTATIONS

1 . . . linear phase FIR filter, 2-1 to 2-n -1 . . . delay units, 3-1 to 3-n . . . multipliers, 4 . . . adder, h(0) to h(n-1) . . . filter coefficients, TIN . . . input terminal, TOUT . . . output terminal, 100, 100A . . . sampling rate converter, 101 . . . input terminal, 102 . . . LPF, 103 . . . up sampler, 104 . . . convolution processing unit, 105 . . . linear interpolation block, 106 . . . output terminal, 200, 200A to 200E . . . sampling rate converter, 201 . . . input terminal, 202 . . . LPF, 203-1 to 203-U . . . convolution processing unit, 204-1 to 204-U . . . up sampler, 205-1 to 205-U-1 . . . delay units, 206-1 to 206-U-1 . . . adders, 207 . . . down sampler, 208 . . . output terminal, 209 . . . LPF, 210 . . . selector, 211 . . . input terminal, 212 . . . FIR filter design unit, 213 . . . first memory, 214 . . . LPF convolution processing unit, 215 . . . second memory, 216 . . . input buffer, 217 . . . convolution processing unit, 218 . . . counter control unit, 219 . . . linear interpolation processing unit, 220 . . . output terminal, 230 . . . selector, 231 . . . input terminal, 232 . . . FIR filter design unit, 233 . . . first memory, 234 . . . input buffer, 235 . . . convolution processing unit, 236 . . . counter control unit, 237 . . . linear interpolation processing unit, 238 . . . LPF convolution processing unit, 239 . . . second memory, 240 . . . output terminal, 300 . . . audio apparatus, 301 . . . input terminal, 302 . . . LR separation circuit (DSB), 303 . . . sampling rate converter (SRC), 304 . . . attenuator (ATT), 305 . . . mute circuit (MUTE), 306 . . . output terminal.

BEST MODE FOR WORKING THE INVENTION

Below, a detailed explanation will be given of preferred embodiments of the present invention with reference to the attached drawings.

First Embodiment

Figure 5:
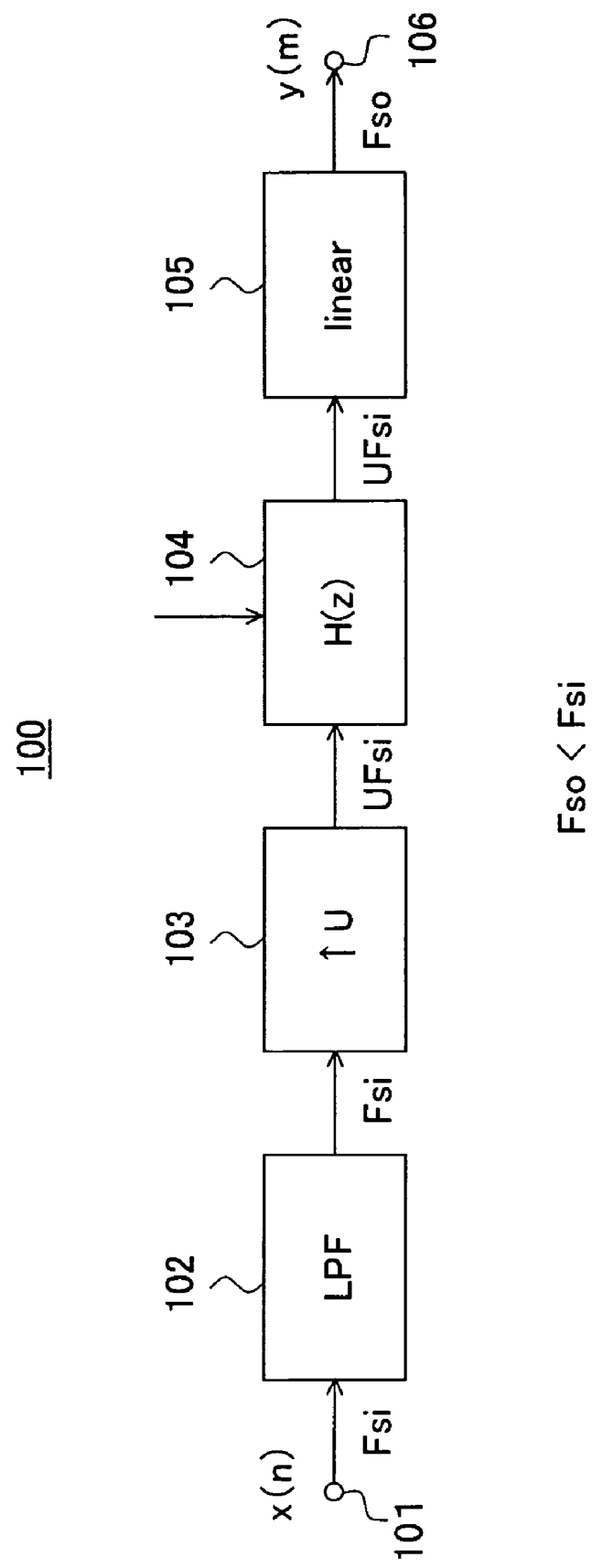
FIG. 5 is a view of the configuration showing a first embodiment of the sampling rate converter according to the present invention.

FIG. 5 is a view of the configuration showing a first embodiment of a sampling rate converter according to the present invention.

In FIG. 5, "U" and "D" are positive integers primary with respect to each other, and H(z) indicates a transmission function of a FIR filter. Further, the upward arrow indicates an up sampler for inserting (U-1) zero points between signals.

Further, Fsi indicates a sampling frequency of input, and Fso indicates a sampling frequency of output. The first embodiment shows an example of the configuration where Fso<Fsi.

Namely, the sampling rate converter 100 has, as shown in FIG. 5, an input terminal 101, low pass filter (LPF) 102, up sampler 103, convolution processing unit 104, linear interpolation block 105, and output terminal 106.

The input terminal 101 receives as input a sample signal x(n) having a sampling frequency Fsi.

The LPF 102 prevents (suppresses) occurrence of folding from the sample signal x(n) of the sampling frequency Fsi input from the input terminal 101 since an aliasing component is generated and the folding occurs where the sampling frequency Fsi of the input is higher than the sampling frequency Fso of the output and outputs the same to the up sampler 103.

The up sampler 103 receives the sample data x(n) having the sampling frequency Fsi input from the input terminal 101 via the LPF 102, inserts (interpolates) U−1 zero points, raises the sampling frequency Fsi Up-fold (over sampling), and outputs the sample signal having a sampling frequency UFsi to the convolution processing unit 104.

The convolution processing unit 104 includes an FIR filter designed based on the Remez Exchange algorithm explained later, performs convolution processing (performs band restriction) shown in the following equation, and outputs the results of processing to the linear interpolation block 105 in the next stage. The convolution processing unit 104 interpolates the value by the convolution of the low pass filter (transmission frequency (H(z)) having a cutoff frequency of 1/Up.

[Equation 4]

$$y(n') = \sum_{i=0}^{\infty} h(i) \times (n' - 1) \quad (4)$$

Here, h(n) is an impulse response of the FIR filter. The output of the convolution (before down sampler) is the sample obtained by inserting the zero point by the up sampler.

Figure 6:
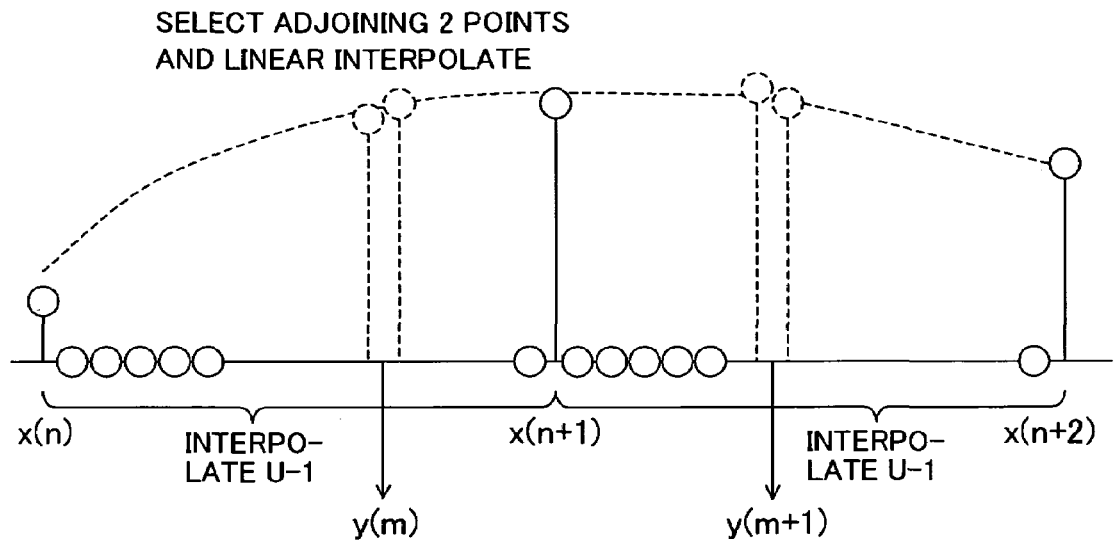
FIG. 6 is a view conceptually showing linear interpolation processing of a linear interpolation block according to the present embodiment.
Figure 7:
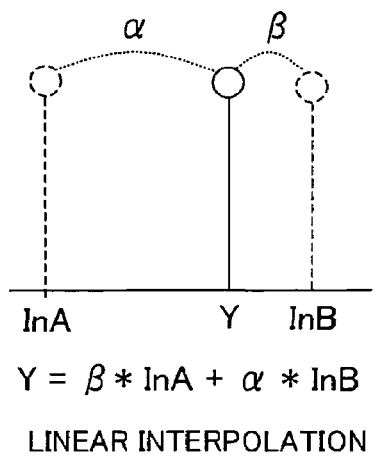
FIG. 7 is a view conceptually showing processing for finding a value at a required position by the linear interpolation processing of the linear interpolation block according to the present embodiment.

The linear interpolation block 105 selects two points of samples from the output signal of the convolution processing unit 104 having the sampling frequency UFsi as shown in FIG. 6 and FIG. 7, finds the value at the required position from linear interpolation as in the following equation (FIG. 7), and outputs the same as a sample signal y(m) from the output terminal 106.

(Equation 5)

$$y(m) = \alpha \times \ln A + \beta \times \ln B$$

$$\beta = 1 - \alpha \quad (5)$$

Below, a detailed description will be given of the method of design of the FIR filter of the convolution processing unit 104.

Figure 1:
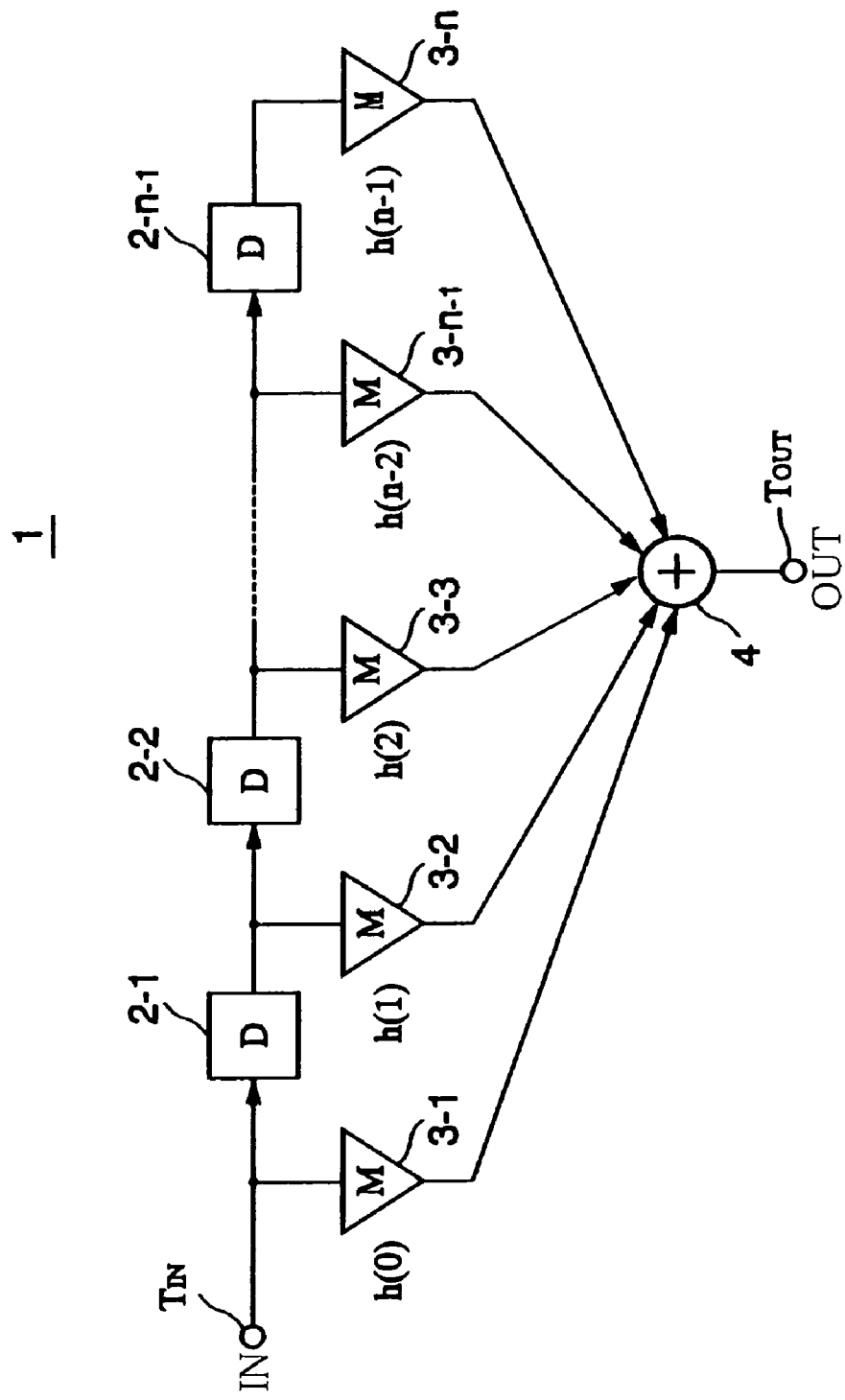
FIG. 1 is a view showing the configuration of a transversal type circuit of an FIR filter.
Figure 2A:
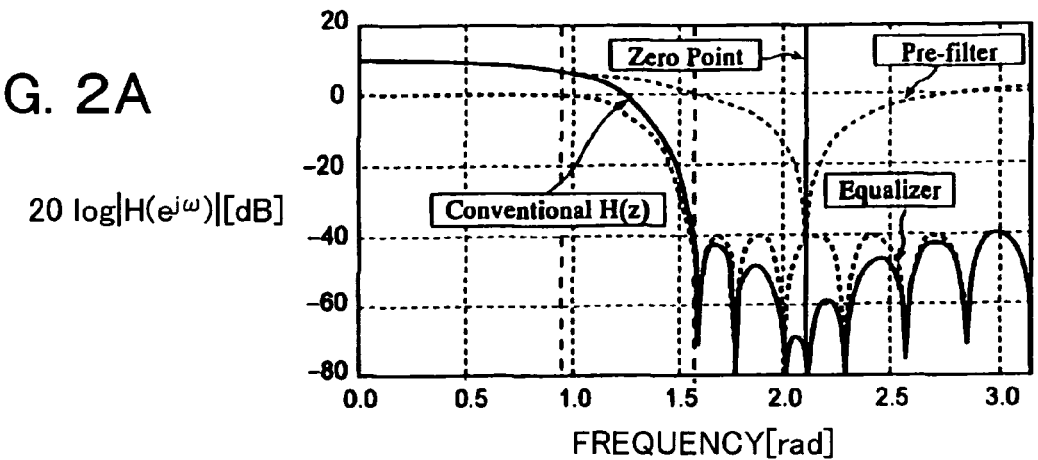
FIGS. 2A to 2C are views showing examples of a frequency response avoiding chessboard distortion and a weighted approximation error in a conventional method.
Figure 2B:
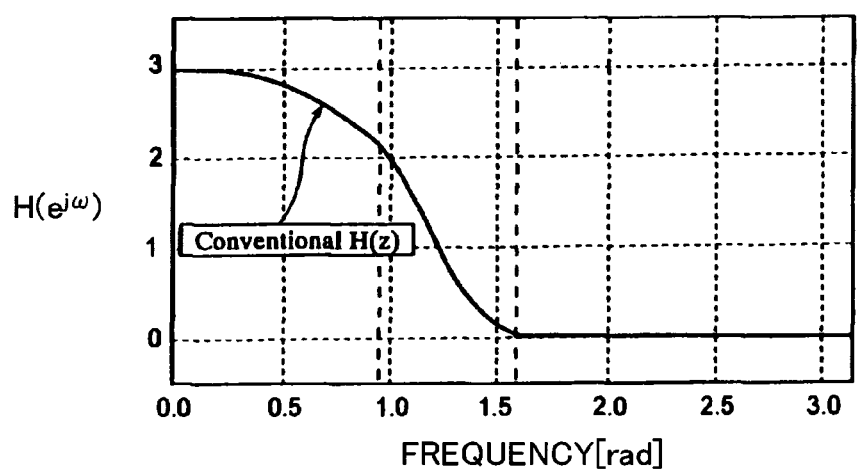
Figure 2C:
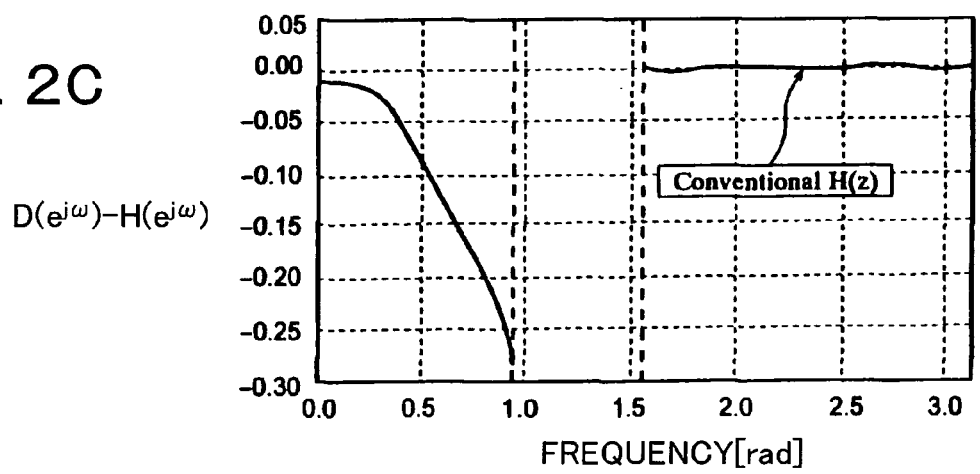
Figure 3A:
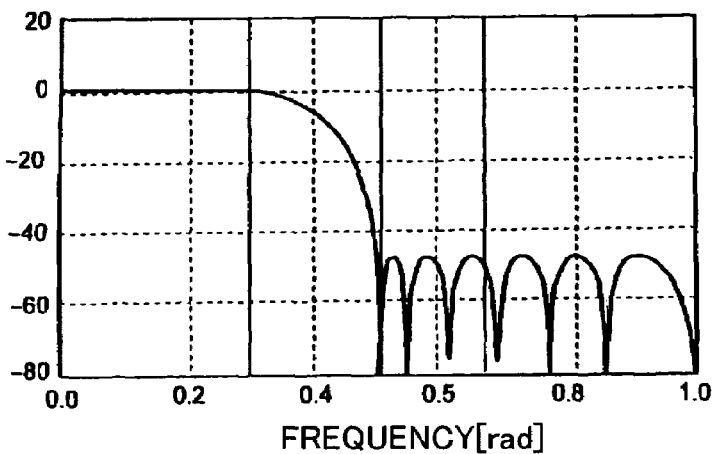
FIGS. 3A to 3C are enlarged views of the frequency response and the vicinity of a gain 1 in the conventional method.
Figure 3B:
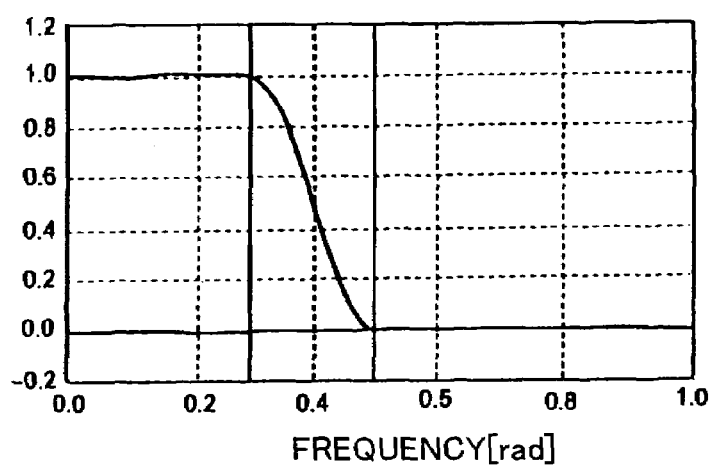
Figure 3C:
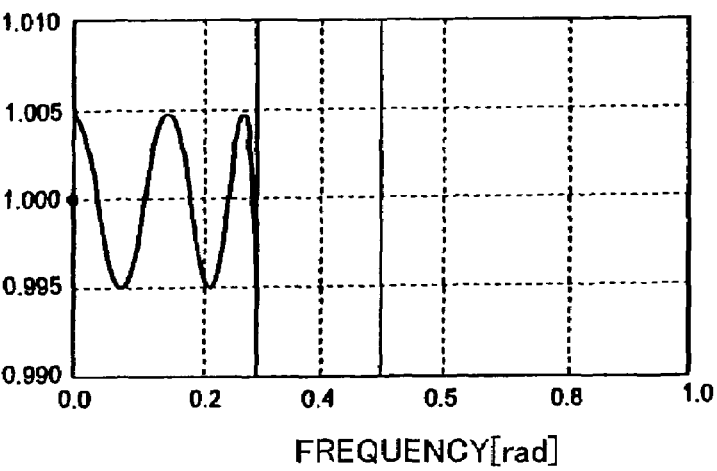
Figure 4:
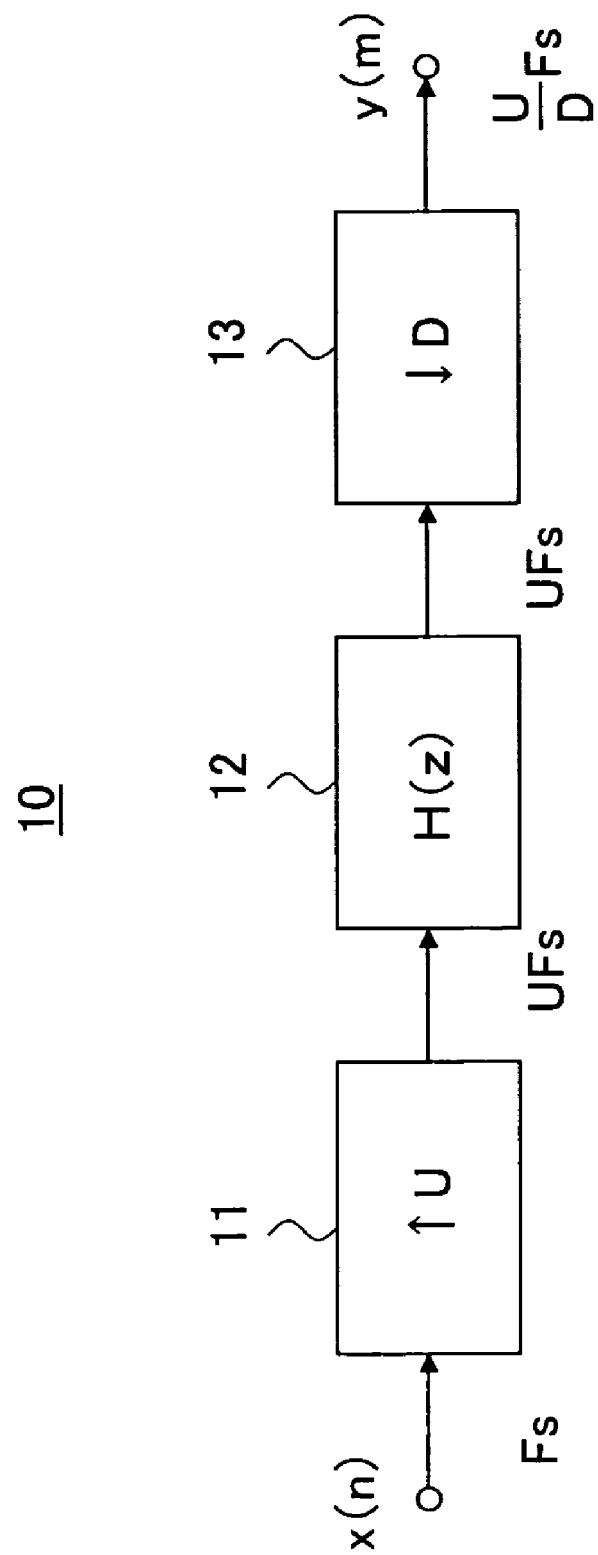
FIG. 4 is a view showing an example of the configuration of a general sampling rate converter.

The linear phase FIR filter according to the present embodiment can equivalently employ a transversal type circuit configuration for example as shown in FIG. 1.

Note that the filter coefficient h(n) is found from the approximated amplitude characteristic by, as will be explained in detail below, expanding the Remez Exchange algorithm, designating the frequency point to be passed, considering the frequency response of the pre-filter, and Chebyshev approximating the desired amplitude characteristic.

Below, an explanation will be given of a specific method of setting the coefficient of the linear phase FIR filter according to the present invention in sequence with reference to the drawings.

As shown in equation (6), the transmission function H(z) of the linear phase FIR filter of N taps is a filter that stands from a product of the transmission function Z(z) of the pre-filter and the transmission function K(z) of the equalizer.

(Equation 6)

$$H(z) = Z(z) \cdot K(z) \quad (6)$$

Here, it is assumed that the pre-filter and the equalizer are linear phase FIR filters of U taps and N−(U−1) taps, and the transmission function of the pre-filter is previously given.

Further, any Np number of frequency points are passed in the frequency domain. Accordingly, the filter design of the transmission function H(z) here is to determine the transmission function K(z) of the equalizer of N−(U−1) taps so that the designated frequency points are passed and the amplitude characteristic $H(e^{j\omega})$ approaches the desired amplitude characteristic $D(e^{j\omega})$.

The number of taps allocated to the equalizer having the transmission function K(z) is set as L=N−(U−1).

The transmission function K(z) of the linear phase FIR filter has the linear phases as shown in FIGS. 8A to 8D, so is classified to four cases.

Specifically, it is classified into a case 1 of odd number taps and even symmetry shown in FIG. 8A, a case 2 of even number taps and even symmetry shown in FIG. 8B, a case 3 of odd number taps and odd symmetry shown in FIG. 8C, and a case 4 of even number taps and odd symmetry shown in FIG. 8D.

Then, the amplitude characteristic function $K(e^{j\omega})$ is held as it is in the case 1, and cases 2 to 4 are rewritten as follows:

[Equation 7]

Case 1: (7-1)

$$\sum_{n=0}^{(L-1)/2} a(n)\cos(n\omega)$$

Case 2: (7-2)

$$\sum_{n=1}^{L/2} b(n)\cos\{(n - 1/2)\omega\} = \cos\left(\frac{\omega}{2}\right) \sum_{n=0}^{L/2-1} \tilde{b}(n)\cos(n\omega)$$

Case 3: (7-3)

$$\sum_{n=1}^{(L-1)/2} c(n)\sin(n\omega) = \sin(\omega) \sum_{n=0}^{(L-3)/2} \tilde{c}(n)\cos(n\omega)$$

Case 4: (7-4)

$$\sum_{n=1}^{L/2} d(n)\sin\left\{\left(n - \frac{1}{2}\right)\omega\right\} = \sin\left(\frac{\omega}{2}\right) \sum_{n=0}^{L/2-1} \tilde{d}(n)\cos(n\omega)$$

Namely, the amplitude characteristic coefficient $K(e^{j\omega})$ is expressed by the product of the function $Q(e^{j\omega})$ of a fixed parameter and a cosine series $P(e^{j\omega})$ including the design parameter shown in FIG. 9. Below, the upper limit of a sum of Equation (7-1) to Equation (7-4) will be expressed by R−1+2×Np. Namely, R is computed as in FIG. 9. Further, a(n); b(n); c(n); and d(n) are totally referred to all together as "p(n)".

When the desired amplitude characteristic is defined as $D(e^{j\omega})$ and the weight with respect to each frequency is $W(e^{j\omega})$, the weighted approximation error is defined as follows:

[Equation 8]

$$E(e^{j\omega}) = W(e^{j\omega})\{D(e^{j\omega}) - H(e^{j\omega})\} \quad (8)$$

[Equation 9]

$$H(e^{j\omega}) = K(e^{j\omega}) \cdot Z(e^{j\omega}) = Q(e^{j\omega}) \cdot P(e^{j\omega}) \cdot Z(e^{j\omega}) \quad (9)$$

When entering Equation (9) into Equation (8), the result becomes as follows.

[Equation 10]

$$E(e^{j\omega}) = \tilde{W}(e^{j\omega})\{\hat{D}(e^{j\omega}) - P(e^{j\omega})\} \quad (10)$$

Note that $\hat{W}(e^{j\omega})$ and $\hat{D}(e^{j\omega})$ are as follows.

[Equation 11]

$$\hat{W}(e^{j\omega})=W(e^{j\omega})\cdot Q(e^{j\omega})\cdot Z(e^{j\omega}) \quad (11)$$

[Equation 12]

$$\hat{D}(e^{j\omega})=D(e^{j\omega})/Q(e^{j\omega})\cdot Z(e^{j\omega}) \quad (12)$$

Equation (10) expresses the weighted approximation errors of the linear phase FIR filter in the four cases of Case 1 to Case 4.

The weighted Chebyshev approximation problem is to determine such a(n); b(n); c(n); and d(n) of Equation (7-1) to Equation (7-4) that minimize the maximum value of $|E(e^{j\omega})|$ in the designated frequency band in Equation (8).

Below, this will be explained with reference to specific examples.

Figure 10:
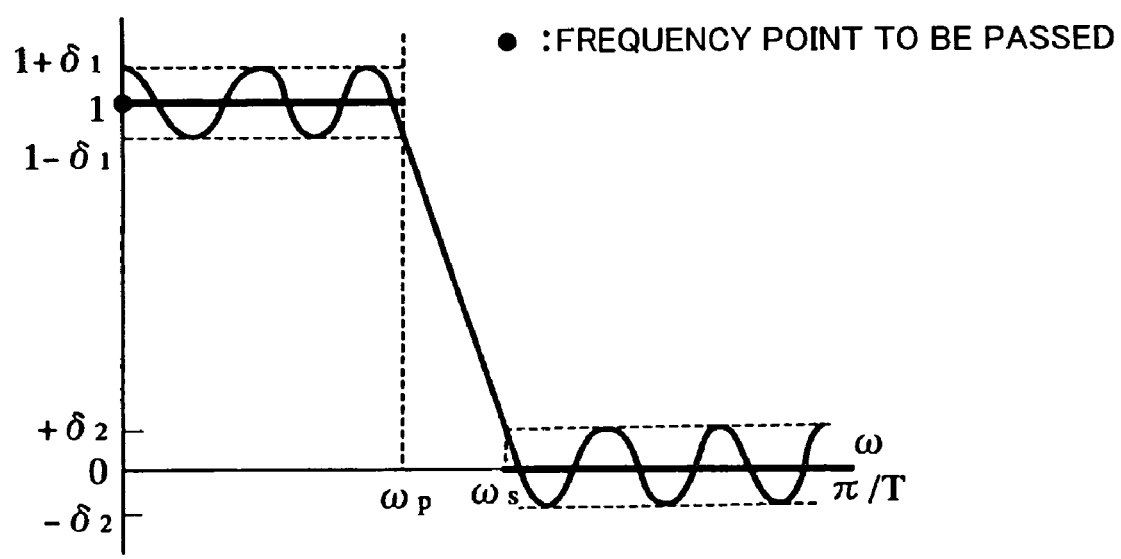
FIG. 10 is a view showing an example of weighted Chebyshev approximation.

Here, as shown in the following description and FIG. 10, the amplitude characteristic $D(e^{j\omega})$ is defined.

[Equation 13]

$$D(e^{j\omega})=1 \text{ (within error} \pm\delta_1, 0<\omega<\omega_p)$$

$$D(e^{j\omega})=0 \text{ (within error} \pm\delta_2, \omega_s<\omega<\pi) \quad (13)$$

Note that when R is given, the values of δ1 and δ2 cannot be freely designated, but the ratio thereof can be designated.

$W(e^{j\omega})$ is set at a constant value W1 at the pass band, while is set at W2 in a blocked frequency and selected so that W1δ1=W2δ2 stands. For example, it is selected so that W1=1 and W2=δ1/δ2. At this time, the following reflection theorem stands.

<Theorem>

The required sufficient conditions for the (R−1)th order cosine series $P(e^{jk\omega})$ to be the best weighted Chebyshev approximation with respect to the target characteristic in a section (0, π) of w are:

(1) $E(e^{j\omega})$ becomes the extreme at least (R+1) times in the section (0, π). The frequency at which the extreme is taken at that time is set as w0<w1<w2<...<wR−1<wR.

(2) The signs of the adjoining extremes are different, and the absolute values of all extremes are equal. Namely, the following conditions are satisfied.

[Equation 14]

$$E(e^{j\omega i})\cdot E(e^{j\omega iii})<0 \ (i=0,1,\ldots,R-1)$$

$$|E(e^{j\omega i})|=|E(e^{j\omega iii})| \ (i=0,1,\ldots,R-1) \quad (14)$$

Accordingly, $|E(e^{j\omega i})|$ is equal to the maximum value of $|E(e^{j\omega})|$ in the section.

The technique for obtaining the best Chebyshev approximation includes the Remez Exchange algorithm based on the reflection theorem (refer to Rabiner, L. R., McClellan, J. H. and Parks, T. W.: "FIR Digital Filter Design Techniques Using Weighted Chebyshev Approximation", *Proc. IEEE*, Vol. 63, April, pp. 595-610, 1975).

The Remez Exchange algorithm Chebyshev approximates the desired amplitude characteristic in the frequency domain and finds the coefficient of the linear phase FIR filter from the approximated amplitude characteristic.

Figure 11:
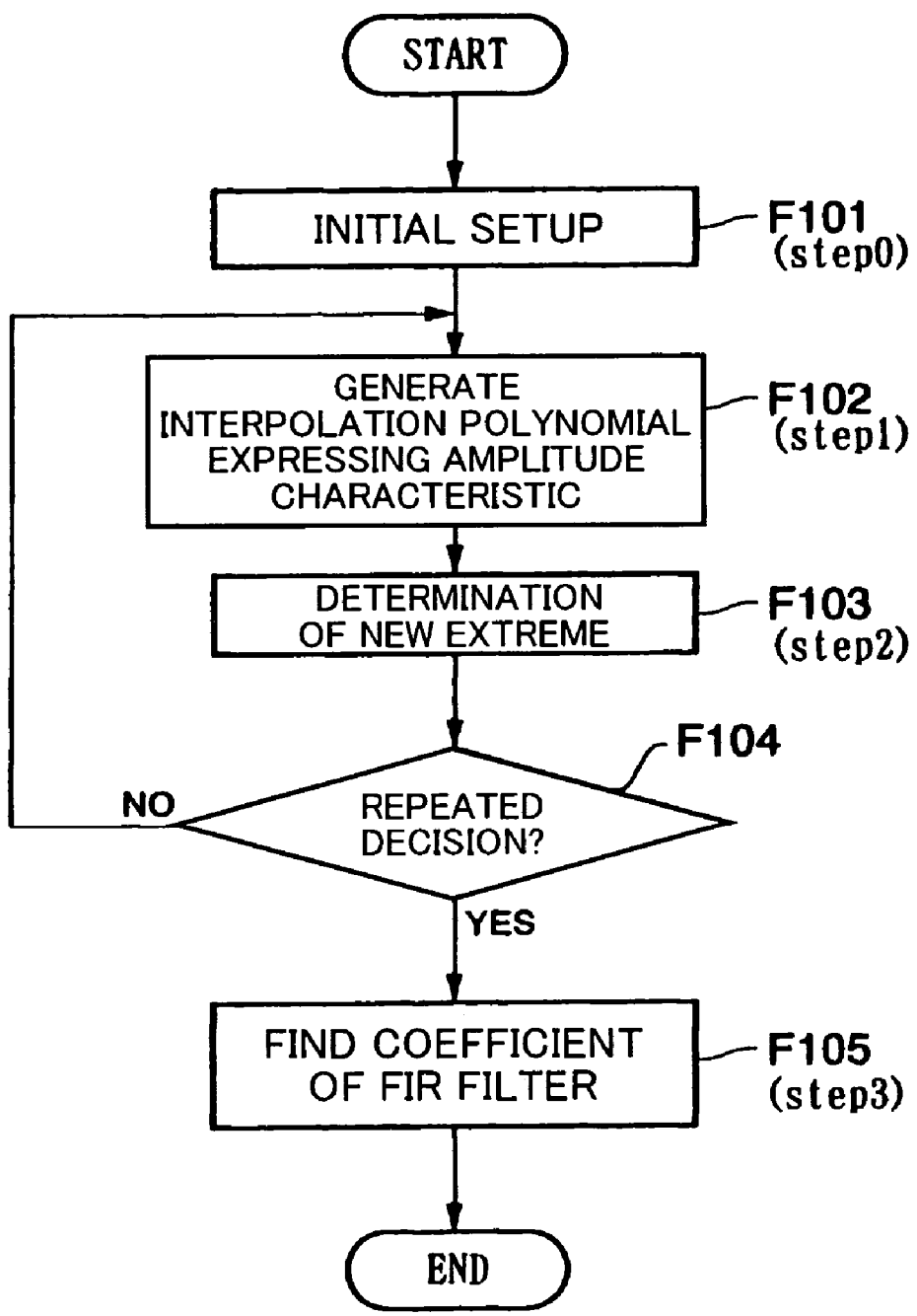
FIG. 11 is a flow chart of a Remez Exchange algorithm considering a frequency response of a pre-filter according to the present invention.

FIG. 11 is a flow chart of the Remez Exchange algorithm passing any frequency point and considering the frequency response of the pre-filter according to the present invention.

A Remez Exchange algorithm considering the frequency response of a specific pre-filter becomes as follows.

<Step 0>

As shown in FIG. 11, first, the initial setup is carried out (F101). In this initial setup, the linear phase FIR filter is set, the band is set, the coefficient of the pre-filter is set, any frequency point to be passed is input, and the initial extreme point is set.

Specifically, the set items are as follows.

Number of taps,

Linear phase FIR filter being even symmetric or odd symmetric,

Number of bands,

Frequencies of both ends of each band,

Desired amplitude value of each band,

Weighting with respect to each band,

Coefficient of pre-filter,

Frequency of point to be passed and amplitude value $(W_{R+1}, D(e^{j\omega R+1}), i=1,\ldots,Np)$ Frequency $w^{(0)}=w_k^{(0)}$ (k=0, ..., R) which becomes the extreme in approximation band.

Note that the superscript (i) expresses the number of times of repetition.

<Step 1>

Next, a Lagrange interpolation polynomial for interpolating the amplitude characteristic from the present extreme point is generated (F102).

The required sufficient condition for the target function of the Chebyshev approximation shown in the above Equation (8) to become the minimum is indicated by the reflection theorem. Therefore, based on the reflection theorem, the parameter p(n) of the following equation is found so that the weighted approximation error $\delta^{(i)}$ from the desired amplitude characteristic is equal at each frequency point and the signs are reflected.

[Equation 15]

$$p(e^{j\omega}) = \sum_{n=0}^{R-1} p(n)\cos(n\omega) \quad (15)$$

Namely, the weighted approximation error of Equation (9) at the frequency point $w^{(i)}=w_k^{(i)}$ (K=0, ..., R) satisfies the following equation:

[Equation 16]@

$$\hat{W}(e^{j\omega k(i)})\{\hat{D}(e^{j\omega k(i)})-P(e^{j\omega k(i)})\}=(-1)^k\delta^{(i)} \ (k=0,1,\ldots,R) \quad (16)$$

Below, for simplification, the superscript (i) is omitted. When modifying Equation (16), it becomes as follows.

[Equation 17]

$$P(e^{j\omega k})+(-1)^k\delta/\hat{W}(e^{j\omega k})=\hat{D}(e^{j\omega k}) \quad (17)$$

$$\sum_{n=0}^{R-1} p(n)\cos(n\omega_k) + \frac{(-1)^k\delta}{\hat{W}(e^{j\omega k})} = \hat{D}(e^{j\omega k})$$

$$(k=0,1,\ldots,R)$$

Then, the equality of the point to be passed in the frequency domain is added as a restriction to Equation (17):

[Equation 18]

$$P(e^{j\omega_k}) = \hat{D}(e^{j\omega_k}) \quad (18)$$

$$\sum_{n=0}^{R-1} p(n)\cos(n\omega_k) = \hat{D}(e^{j\omega_k}),$$

$$(k = R+1, \ldots, R+N_p)$$

When expressing Equation (17) and Equation (18) in a matrix, they become as follows.

[Equation 19]

$$\begin{bmatrix} 1 & \cos(\omega_0) & \cos(2\omega_0) & \cdots & \cos((R-1)\omega_0) & \frac{1}{\hat{W}(e^{j\omega_0})} \\ 1 & \cos(\omega_1) & \cos(2\omega_1) & \cdots & \cos((R-1)\omega_1) & \frac{-1}{\hat{W}(e^{j\omega_1})} \\ \vdots & \vdots & \vdots & \ddots & \vdots & \vdots \\ 1 & \cos(\omega_{R-1}) & \cos(2\omega_{R-1}) & \cdots & \cos((R-1)\omega_{R-1}) & \frac{(-1)^{R-1}}{\hat{W}(e^{j\omega_{R-1}})} \\ 1 & \cos(\omega_R) & \cos(2\omega_R) & \cdots & \cos((R-1)\omega_R) & \frac{(-1)^R}{\hat{W}(e^{j\omega_R})} \\ 1 & \cos(\omega_{R+1}) & \cos(2\omega_{R+1}) & \cdots & \cos((R-1)\omega_{R+1}) & 0 \\ \vdots & \vdots & \vdots & \ddots & \vdots & \vdots \\ 1 & \cos(\omega_{R+N_p}) & \cos(2\omega_{R+N_p}) & \cdots & \cos((R-1)\omega_{R+N_p}) & 0 \end{bmatrix} \quad (19)$$

$$\begin{bmatrix} p(0) \\ p(1) \\ \vdots \\ p(R-1) \\ \delta \end{bmatrix} = \begin{bmatrix} \hat{D}(e^{j\omega_0}) \\ \hat{D}(e^{j\omega_1}) \\ \vdots \\ \hat{D}(e^{j\omega_{R-1}}) \\ \hat{D}(e^{j\omega_R}) \\ \hat{D}(e^{j\omega_{R+1}}) \\ \vdots \\ \hat{D}(e^{j\omega_{R+N_p}}) \end{bmatrix}$$

However, there is a very large amount of processing for solving this equation, so δ will be analytically found first.

[Equation 20]

$$\delta = \frac{\sum_{j=0}^{R} \alpha_j \hat{D}(e)^{j\omega_1}}{\sum_{j=0}^{R} (-1)^j \alpha_j / \hat{W}(e^{j\omega_1})} \quad (20)$$

[Equation 21]

$$\alpha_k = \prod_{\substack{j=0 \\ j \neq k}}^{R} \frac{1}{(x_k - x_j)} \quad (21)$$

-continued

[Equation 22]

$$x_j = \cos(\omega_j) \quad (22)$$

αk is a remainder factor of elements of the k-th row and (R+1)th column in a matrix F. Note, for $\hat{W}(e^{j\omega})$ and $\hat{D}(e^{j\omega})$, Equation (11) and Equation (12) are used.

Next, the following equations are set by using this δ.

[Equation 23]

$$C_k = \hat{D}(e^{j\omega_k}) - (-1)^k \frac{\delta}{\hat{W}(e^{j\omega_k})} \quad (23)$$

$$(k = 0, \ldots, R)$$

[Equation 24]

$$C_k = \hat{D}(e^{j\omega_k}), \quad (24)$$

$$(k = R+1, \ldots, R+N_p)$$

In order to find the amplitude characteristic of the frequency other than the extreme point, the Lagrange interpolation polynomial is used this time as the interpolation polynomial for interpolation by using the extreme point and the frequency point to be passed. Namely, $P(e^{j\omega})$ is computed by performing interpolation so that the value Ck is taken by wk(k=0, ..., R+Np) by using the Lagrange interpolation polynomial.

[Equation 25]

$$P(e)^{j\omega} = \frac{\sum_{k=0}^{R+N_p} C_k \left( \frac{\beta_k}{x - x_k} \right)}{\sum_{k=0}^{R+N_p} \left( \frac{\beta_k}{x - x_k} \right)} \quad (25)$$

[Equation 26]

$$\beta_k = \prod_{\substack{j=0 \\ j \neq k}}^{R+N_p} \frac{1}{(x_k - x_j)} \quad (26)$$

[Equation 27]

$$x = \cos(\omega) \quad (27)$$

This result corresponds to Equation (19) being solved.

<Step 2>

A new extreme point is found from the amplitude characteristic found from the interpolation polynomial (F103). It is repeatedly decided whether or not the optimum approximation is obtained (F104).

Each extreme point wk of the result of above step 1 does not always become the extreme of the weighted error function $E(e^{j\omega})$. A point where $|E(e^{j\omega})|$ becomes larger than $\delta^{(i)}$ sometimes exists. Therefore, the new extreme point $w^{(i+1)}$ is determined by the all point simultaneous replacement method.

<All Point Simultaneous Replacement Method>

Based on the following equation, the extreme of the weighted approximation error computed from the extreme point used for interpolation is searched for over the approximation band. This is defined as a new extreme point $w^{(i+1)}=w_k^{(i+1)}$ (k=0, 1, ..., R), then the routine returns to the processing of step 1.

[Equation 28]

$$E(e^{j\omega}) = \hat{W}(e^{j\omega})\{\hat{D}(e^{j\omega}) - P(e^{j\omega})\} \quad (28)$$

It is assumed that the optimum approximation is obtained when the position of the extreme no longer changes. This is the end condition of the repetition. The routine then proceeds to the processing of the next step 3.

Figure 12A:
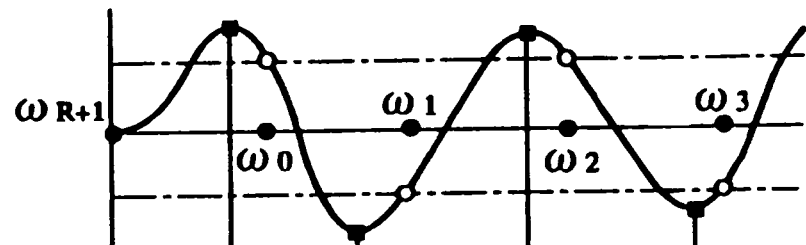
FIGS. 12A to 12C are views for explaining a method for determining a new extreme of a weighted approximation error $E(e^{j\omega})$.
Figure 12B:
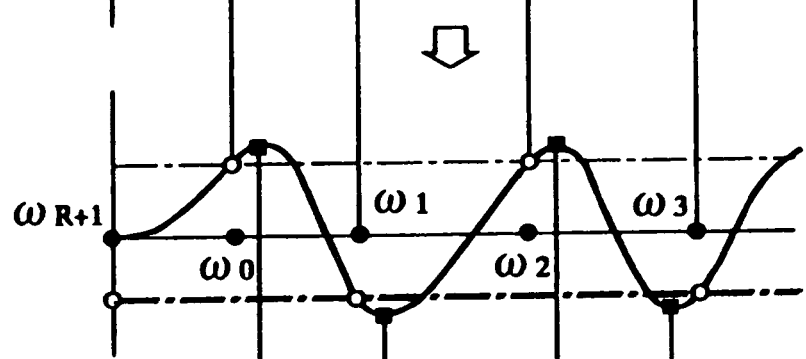
Figure 12C:
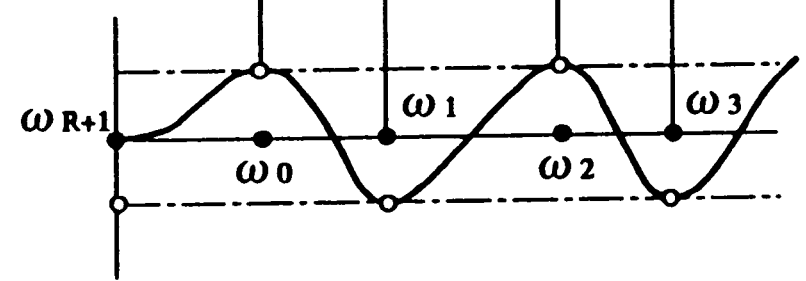

FIGS. 12A to 12C are conceptual views of the all point replacement method.

Simply explaining this, the black dots in FIGS. 12A to 12C express extreme points used for the interpolation. The weighted approximation error $E(e^{j\omega})$ found from this extreme point corresponds to the solid line.

As shown in FIG. 12A, the value of the weighted approximation error at the extreme point of a black dot becomes a white dot, but the actual extreme is the frequency indicated by a square. Therefore, the routine returns to the processing of step 1 while defining the frequency indicated by the square as the new extreme point.

Further, as shown in FIG. 12B, the frequency of the extreme point used for the interpolation and the frequency of the actual extreme are offset, therefore the frequency indicated by the square is defined as the new extreme point, then the routine returns to the processing of step 1.

Then, as shown in FIG. 12C, the repetition ends when the extreme point used for the interpolation and the extreme point (white dot) of the actual weighted approximation error become the same.

<Step 3>

The coefficient of the linear phase FIR filter is found from the approximated amplitude characteristic (F105).

When finding the impulse response h(n) of N taps from the optimum approximate function $P(e^{j\omega})$, it is found from the following equation in place of finding the same from p(n).

[Equation 29]

$$H(e^{j\omega}) = P(e^{j\omega}) \cdot Q(e^{j\omega}) \cdot Z(e^{j\omega}) \quad (29)$$

[Equation 30]

Case 1: (30)

$$h(n) = \frac{1}{N}\left\{H(0) + 2\sum_{k=1}^{\frac{N-1}{2}}(-1)^k H\left(\frac{2\pi}{N}k\right)\cos\left(\frac{2\pi}{N}k\left(n+\frac{1}{2}\right)\right)\right\}$$

[Equation 31]

Case 2: (31)

$$h(n) = \frac{2}{N}\sum_{k=0}^{\frac{N}{2}-1}(-1)^k H\left(\frac{2\pi}{N}\left(k+\frac{1}{2}\right)\right)\sin\left(\frac{2\pi}{N}\left(k+\frac{1}{2}\right)\left(n+\frac{1}{2}\right)\right)$$

[Equation 32]

Case 3: (32)

$$h(n) = -\frac{2}{N}\sum_{k=0}^{\frac{N-1}{2}}(-1)^k H\left(\frac{2\pi}{N}k\right)\sin\left(\frac{2\pi}{N}k\left(n+\frac{1}{2}\right)\right)$$

[Equation 33]

Case 4: (33)

$$h(n) = \frac{2}{N}\sum_{k=0}^{\frac{N}{2}-1}(-1)^k H\left(\frac{2\pi}{N}\left(k+\frac{1}{2}\right)\right)\cos\left(\frac{2\pi}{N}\left(k+\frac{1}{2}\right)\left(n+\frac{1}{2}\right)\right)$$

Further, when finding the impulse response k(n) of the equalizer of L=N-(U-1) taps, it is computed from the following equation.

[Equation 34]

$$K(e^{j\omega}) = P(e^{j\omega}) \cdot Q(e^{j\omega}) \quad (34)$$

[Equation 35]

Case 1: (35)

$$k(n) = \frac{1}{L}\left\{K(0) + 2\sum_{k=1}^{\frac{L-1}{2}}(-1)^k K\left(\frac{2\pi}{L}k\right)\cos\left(\frac{2\pi}{L}k\left(n+\frac{1}{2}\right)\right)\right\}$$

[Equation 36]

Case 2: (36)

$$k(n) = \frac{2}{L}\sum_{k=0}^{\frac{L}{2}-1}(-1)^k K\left(\frac{2\pi}{L}\left(k+\frac{1}{2}\right)\right)\sin\left(\frac{2\pi}{L}\left(k+\frac{1}{2}\right)\left(n+\frac{1}{2}\right)\right)$$

[Equation 37]

Case 3: (37)

$$k(n) = -\frac{2}{L}\sum_{k=0}^{\frac{L-1}{2}}(-1)^k K\left(\frac{2\pi}{L}k\right)\sin\left(\frac{2\pi}{L}k\left(n+\frac{1}{2}\right)\right)$$

[Equation 38]

Case 4: (38)

$$k(n) = \frac{2}{L}\sum_{k=0}^{\frac{L}{2}-1}(-1)^k K\left(\frac{2\pi}{L}\left(k+\frac{1}{2}\right)\right)\cos\left(\frac{2\pi}{L}\left(k+\frac{1}{2}\right)\left(n+\frac{1}{2}\right)\right)$$

If the transmission function Z(z) of the pre-filter is 1 as shown in the following equation, it is the same as the Remez Exchange algorithm passing through any frequency point.

(Equation 39)

$$Z(z) = 1 \quad (39)$$

Further, in the case where there is no frequency point to be passed through the pre-filter, when Np=0, it is the same as a Remez Exchange algorithm considering the frequency response of the pre-filter.

Further, when the transmission function Z(z) of the pre-filter is 1 as shown in the following equation and there is no frequency point to be passed, when Np=0, it is the same as an ordinary Remez Exchange algorithm.

(Equation 40)

$$Z(z) = 1 \quad (40)$$

FIGS. 13A to 13D are views showing the frequency response of the low pass filter designed by the Remez Exchange algorithm expanded so that any frequency point is passed and the frequency response of the pre-filter can be considered for the following specifications.

Note that in the following explanation, the zero point for avoiding chessboard distortion will be handled as a pre-filter.

The frequency response of the pre-filter is expressed as follows.

[Equation 41]

$$z(e^{j\omega}) = (1 + e^{-j\omega} + e^{-2j\omega} + \ldots + e^{-j\omega(U-1)}) \quad (41)$$

$$= \begin{cases} 1 + \sum_{m=0}^{(U-1)/2} 2\cos(m\omega), & U; \text{odd} \\ \sum_{m=0}^{U/2} 2\cos\{(m+1/2)\omega\}, & U:\text{even} \end{cases}$$

The specifications will be shown below.
<Linear phase FIR filter>
24 taps
Even symmetric
24 taps
Even symmetric
Pre-filter U=3 of Equation (2) (adjusted so that DC gain becomes U)
<Design method>
Designed by Remez Exchange algorithm passing through any frequency point and considering frequency response of pre-filter.

TABLE 1

| Band | Frequency range | Gain | Weight |
|---|---|---|---|
| | Band | | |
| 1 | $0 \leq \omega \leq 0.3\pi$ | 3 | 1 |
| 2 | $0.5\pi \leq \omega \leq \pi$ | 0 | 1 |

TABLE 2

| Designated frequency point | |
|---|---|
| Frequency | Gain |
| $\omega = 3$ | 3 |

Figure 13A:
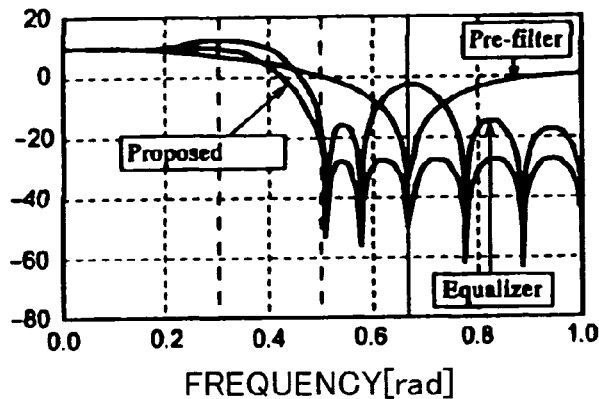
FIGS. 13A to 13D are views showing a frequency response when designating any frequency point of the present invention and enlarged views thereof.
Figure 13B:
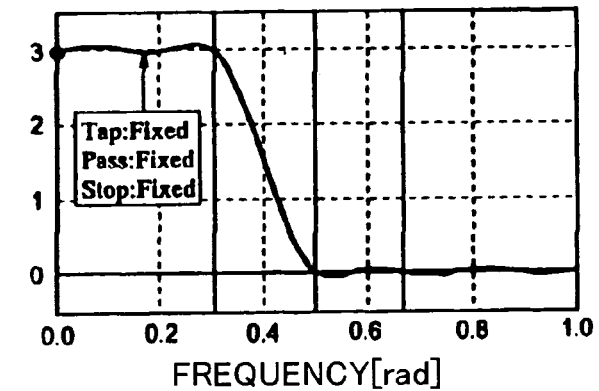
Figure 13C:
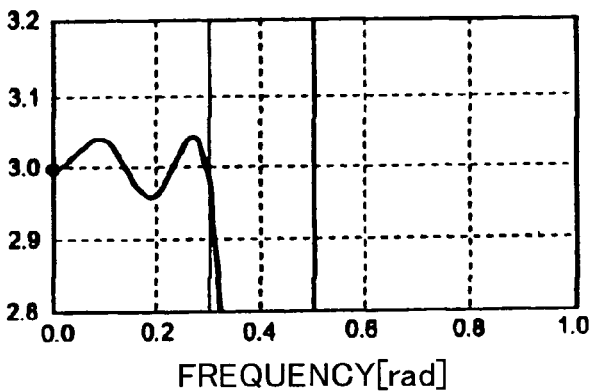

FIG. 13A is a view showing the frequency response displayed by decibels, FIG. 13B is a view showing the frequency response displayed while keeping the value as it is, FIG. 13C is a view enlarging the vicinity of the gain 3, and FIG.13C is a view enlarging the vicinity of the gain 0.

In FIGS. 13A to 13D, the dotted lines indicate the frequency characteristics of the pre-filter and the frequency characteristics of the equalizer, the solid curves indicate the finally obtained frequency characteristics (Proposed H(z)), the vertical solid lines indicate the frequencies (zero point) where H(z)=0 must stand so as to avoid chessboard distortion, and the black dots indicate sections of the band.

From FIG. 13A, it can be confirmed that the gain of the pass band maintains a constant value and passes the zero point for avoiding chessboard distortion.

Further, it can be confirmed from FIG. 13C that the designated frequency point is passed.

Figure 13D:
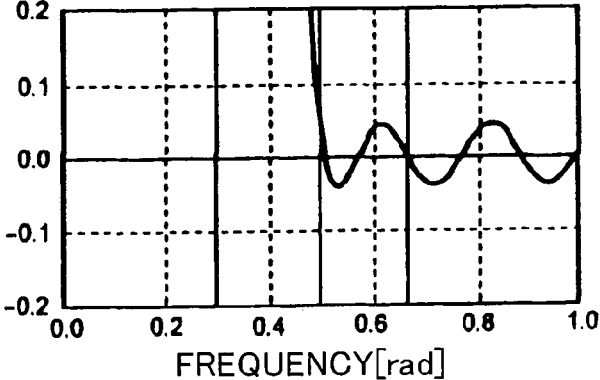

Further, it can be confirmed from FIGS. 13C and 13D that an equal ripple is held.

Namely, a low pass filter designed by a Remez Exchange algorithm which passes any frequency point and is enlarged so that the frequency response of the pre-filter can be considered can give a good frequency response characteristic.

Next, an explanation will be given of the operation of the sampling rate converter having the above configuration.

The sample data x(n) having the sampling frequency Fs input from the input terminal 101 is input to the LPF 102.

In the LPF 102, the occurrence of folding from the sample signal x(n) of the sampling frequency Fsi input from the input terminal 101 is prevented (suppressed) and the signal is output to the up sampler 103.

In the up sampler 103, (U-1) zero points are inserted between signals, the sampling frequency Fsi is raised U-fold, and the sample signal having the sampling frequency UFsi is output to the convolution processing unit 104

The convolution processing unit 104 performs the convolution processing based on Equation (3), restricts the band of the sample signal, and supplies the same to the linear interpolation block 105 in the next stage.

At this time, the output of the convolution (before down sampler) is the sample obtained by inserting the zero point by the up sampler.

Then, the linear interpolation block 105 selects two points of samples from the output signal of the convolution processing unit 104 of the sampling frequency UFsi. Then, the value at the required position is found from linear interpolation.

By this, the sample signal y(m) having the sampling frequency Fso is output from the output terminal 106.

In the sampling rate converter 100 having the above function, the FIR filter of the convolution processing unit 104 is a linear phase FIR filter in which the impulse response becomes the filter coefficient, the transmission function H(z) is associated with the transmission function Z(z) of the pre-filter and the transmission function K(z) of the equalizer and associated with the frequency point to be passed and the frequency response of the pre-filter, and the filter coefficient is set based on the amplitude characteristic of the equalizer obtained by performing weighted approximation with respect to the desired characteristic by using a Remez Exchange algorithm passing through any frequency point and considering the frequency response of the pre-filter with reference to the frequency point to be passed and the frequency response of the pre-filter, therefore the present sampling rate converter has the following advantages.

Namely, chessboard distortion can be avoided. Further, any pre-filter can be considered, and any frequency point can be passed.

Further, provision was made of the up sampler 103 for inserting (U-1) zero points between signals and raising a sampling frequency Fsi U-fold, the convolution 103 for inserting (U-1) zero points between signals and convolution of the low pass filter (transmission function H(z)) having the cutoff frequency of 1/Up, and the linear interpolation block 105 for selecting two points of samples from the output signal of the convolution processing unit 104 having the sampling frequency UFsi and finding the value at the required position from the linear interpolation, therefore, as shown in Table 3, there is the advantage that sampling rate conversion wherein the cutoff frequency is severe becomes possible.

Table 3 shows the frequency band supported by the sampling rate converter according to the present embodiment.

TABLE 3

Table 3. Frequency Supported by Sampling Rate Conversion of Present Invention

| Input (Fsi) | Output (Fso) | | | | | | | |
|---|---|---|---|---|---|---|---|---|
| | 8 kHz | 11.025 kHz | 12 kHz | 22.05 kHz | 24 kHz | 32 kHz | 44.1 kHz | 48 kHz |
| 8 kHz | — | ○ | Δ | ○ | Δ | Δ | ○ | Δ |
| 11.025 kHz | ○ | — | ○ | Δ | ○ | ○ | Δ | ○ |
| 12 kHz | Δ | ○ | — | ○ | Δ | Δ | ○ | Δ |
| 22.05 kHz | ○ | Δ | ○ | — | ○ | ○ | Δ | ○ |
| 24 kHz | Δ | ○ | Δ | ○ | — | Δ | ○ | Δ |
| 32 kHz | Δ | ○ | Δ | ○ | Δ | — | ○ | Δ |
| 44.1 kHz | ○ | Δ | ○ | Δ | ○ | ○ | — | ○ |
| 48 kHz | Δ | ○ | Δ | ○ | Δ | Δ | ○ | — |
| 96 kHz | Δ | ○ | Δ | ○ | Δ | Δ | ○ | Δ |

In Table 3, the sampling frequencies Fsi of the input are 8 kHz, 11.025 kHz, 12 kHz, 22.05 kHz, 24 kHZ, 32 kHz, 44.1 kHz, 48 kHz, and 96 kHz, and the sampling frequencies Fso of the outputs are 8 kHz, 11.025 kHz, 12 kHz, 22.05 kHz, 24 kHz, 32 kHz, 44.1 kHz, and 48 kHz.

In Table 3, the portions of "Δ" are frequencies which can be achieved by the sampling rate converter based on the general multi-rate signal processing. In general, those based on multi-rate signal processing have better characteristic of attenuation and are easier in control of the pass band etc., but achievement is possible also by the sampling rate converter according to the present embodiment.

Further, according to the first embodiment, the LPF 102 is provided between the input terminal 101 and the up sampler 103, therefore, when the sampling frequency Fsi of the input is higher than the sampling frequency Fso of the output, the occurrence of the aliasing component and the occurrence of folding can be suppressed.

Second Embodiment

Figure 14:
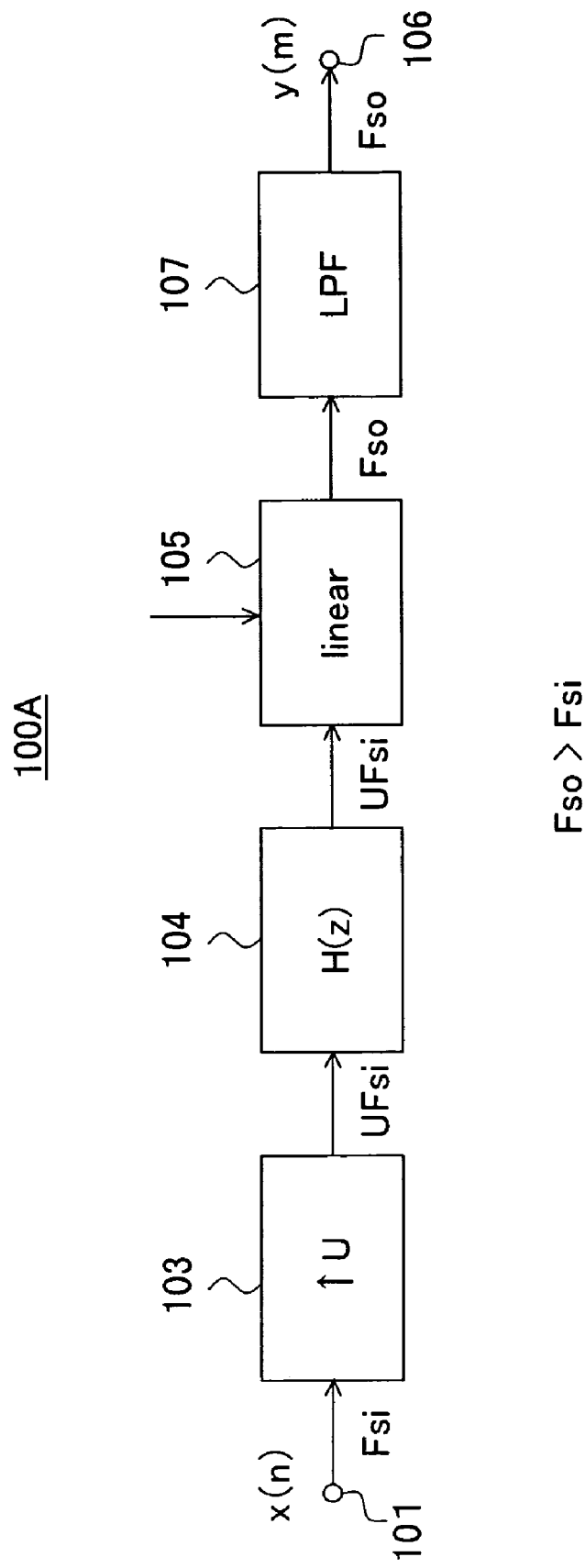
FIG. 14 is a view of the configuration showing a second embodiment of a sampling rate converter according to the present invention.

FIG. 14 is a view of the configuration showing a second embodiment of the sampling rate converter according to the present invention.

The difference of the second embodiment from the first embodiment explained above resides in that an LPF 107 is provided between the linear interpolation block 105 and the output terminal 106 in place of providing the LPF 102 between the input terminal 101 and the up sampler 103, and the configuration is made so that an imaging component occurs when the sampling frequency Fsi of the input is lower than the sampling frequency Fso of the output, and occurrence of a frequency component which does not exist in the original data is prevented (suppressed).

The rest of the configuration is the same as that of the first embodiment explained above.

According to the second embodiment, there are the advantages that the occurrence of a frequency component which does not exist in the original data can be prevented (suppressed), and, in the same way as the first embodiment, chessboard distortion can be avoided, and the optional pre-filter can be considered, any frequency point can be passed, and sampling rate conversion wherein the cutoff frequency is severe becomes possible.

Note that it is also possible to provide the LPF 102 between the input terminal 101 and the up sampler 103 and provide the LPF 107 between the linear interpolation block 105 and the output terminal 106.

Third Embodiment

Figure 15:
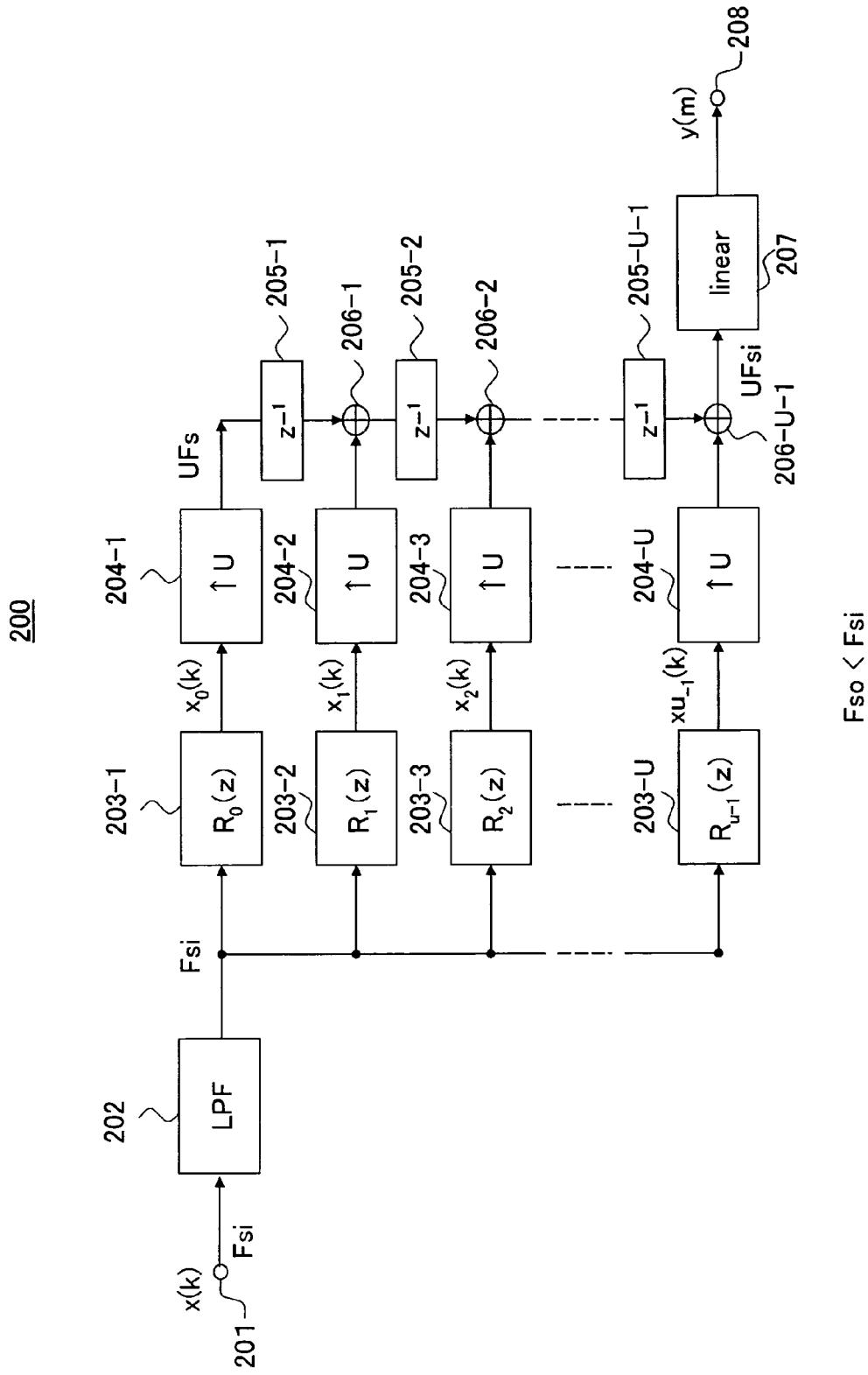
FIG. 15 is a view of the configuration showing a third embodiment of a sampling rate converter according to the present invention.

FIG. 15 is a view of the configuration showing a third embodiment of the sampling rate converter according to the present invention.

Note that, in FIG. 15, "U" and "D" are positive integers primary with respect to each other, and R(z) indicates the transmission function of the poly-phase filter. Further, the upward arrow indicates the up sampler inserting (U-1) zero points between signals.

The difference of the third embodiment from the first embodiment explained above resides in that the FIR filter is so-called "poly-phase decomposed" to U number of filters and a poly-phase configuration is employed.

Here, an explanation will be given of the poly-phase decomposition first.

<Poly-Phase Decomposition>

The sampling rate converter restricts the band by using the (N−1)th order FIR filter (transmission function H(z)) and interpolates the sample of the zero point

[Equation 42]

$$H(z) = \sum_{n=0}^{N-1} h(n)z^{-n} \quad (42)$$

The cutoff frequency $\omega_c$ of this FIR filter becomes as follows:

[Equation 43]

$$wc = \pi/\max U, D \quad (43)$$

The configuration of FIG. 5 can be equivalently expressed as in FIG. 5 by the poly-phase configuration. The transmission function H(z) of the filter of Equation (42) and the transmission function Ri(z) of the poly-phase filter are expressed by the following relationship.

[Equation 44]

$$H(z) = R_{U-1}(z^U) + z^{-1}R_{U-2}(z^U) + \ldots + z^{-(U-1)}R_0(z^U) \quad (44)$$

$$= \sum_{n=0}^{U-1} Ri(z^U)z^{(U-1-i)}$$

-continued

[Equation 45]

$$Ri(z) = \sum_{n=0}^{N/U-1} h(Un - i - 1 + U)z^{-n} \quad (45)$$

Note that the calculation is carried out by raising N to a whole multiple of U or, where insufficient for NU taps, assuming that the coefficient of 0 exists.

The input/output relationship of the interpolator shown in FIG. 15 becomes as follows by the convolution and the processing of the up sampler when expressing the impulse response of the poly-phase filter Ri(z) as ri(n).

[Equation 46]

$$y(m) = \begin{cases} x_0\left(\frac{m-(U-1)}{U}\right), & m = kU + (U-1) \\ \vdots \\ x_{U-2}\left(\frac{(m-1)}{U}\right), & m = kU + 1 \\ x_{U-1}\left(\frac{m}{U}\right), & n = kU \end{cases} \quad (46)$$

Note that k is an integer, and xi(m) becomes as follows:

[Equation 47]

$$xi(m) = \sum_{n=0}^{\infty} n(n) \times (m-n) \quad (47)$$

The sampling rate converter 200 according to the third embodiment has, as shown in FIG. 15, an input terminal 201, LPF 202, convolution processing units 203-1 to 203-U, up samplers 204-1 to 204-U, delay units 205-1 to 205-U-1, adders 206-1 to 206-U-11, a linear interpolation block 207, and output terminal 208.

Among these components, the adding means is configured by the delay units 205-1 to 205-U-1 and the adders 206-1 to 206-U-1.

The input terminal 201 receives as input the sample signal x(n) having the sampling frequency Fs.

When the sampling frequency Fsi of the input is higher than the sampling frequency Fso of the output, an aliasing component is generated and folding occurs, therefore the LPF 202 prevents (suppresses) the occurrence of folding from the sample signal x(n) of the sampling frequency Fsi input from the input terminal 201 and outputs the results to the convolution processing units 203-1 to 203-U.

The convolution processing units 203-1 to 203-U include the poly-phase filters obtained by poly-phase decomposing the FIR filter designed based on the above-explained Remez Exchange algorithm, perform the convolution processing between the input sample signals and poly-phase filters based on the above Equation (47), and output the results of processing to the up samplers 204-1 to 204-U in the next stage.

The up samplers 204-1 to 204-U receive the output sample signals of the convolution processing units 203-1 to 203-U, insert (U-1) zero points, raise the sampling frequencies Fsi U-fold, and output sample signals having the sampling frequency UFsi.

The delay unit 205-1 delays the sample signal having the sampling frequency UFs by the up sampler 204-1 by a predetermined time and outputs the result to the adder 206-1.

Further, the delay units 205-2 to 205-U-1 delay the output signals of the adders 206-1 to 206-U-2 by the predetermined time and output the results to the adders 206-2 to 206-U-1.

The adder 206-1 adds the sample signal having the sampling frequency UFsi by the up sampler 204-2 and the sample signal delayed by the delay unit 205-1 and outputs the result to the delay unit 205-2.

The adder 206-2 adds the sample signal having the sampling frequency UFsi by the up sampler 204-3 and the sample signal delayed by the delay unit 205-2 and outputs the result to the delay unit 205-3.

In the same way, the adder 206-U-1 adds the sample signal having the sampling frequency UFsi by the up sampler 204-U and the sample signal delayed by the delay unit 205-U-1 and outputs the result to the linear interpolation block 207.

The linear interpolation block 207 selects two points of samples from the output signal of the adder 206-U-1, that is, the signal obtained by adding sample signals having sampling frequencies multiplied by U by the up samplers 204-1 to 204-U-1, finds the value at the required position (FIG. 7) from the linear interpolation as in above Equation (5), and outputs the result as the sample signal y(m) from the output terminal 208.

In the sampling rate converter 200, sample signals x(n) having frequencies Fs input from the input terminal 201 are input in parallel to the convolution processing units 203-1 to 202-U including the poly-phase filters after the occurrence of folding is prevented (suppressed) at the LPF 202.

The convolution processing units 203-1 to 203-U perform the convolution processing of the input sample signals and poly-phase filters and supply the results of processing to the up samplers 204-1 to 204-U in the next stage.

The up samplers 204-1 to 204-U insert (U-1) zero points between output sample signals of the convolution processing units 203-1 to 203-U, raise the sampling frequency Fsi U-fold, and output sample signals having the sampling frequency UFsi.

The output signals of the up samplers 204-1 to 204-U are delayed by the delay units 205-1 to 205-U-1 and adders 206-1 to 206-U-1, then cumulatively added and supplied to the linear interpolation block 207.

Then, the linear interpolation block 207 selects two points of samples from the output signal of the adder 206-U-1 having the sampling frequency UFsi. Then, the value at the required position is found from the linear interpolation.

By this, the sample signal y(m) having the sampling frequency Fso is output from the output terminal 208.

According to the third embodiment, in addition to the effects of the first embodiment explained above, there are the advantages that the amount of processing can be suppressed to the required lowest limit, and an improvement of the processing speed can be achieved.

Fourth Embodiment

Figure 16:
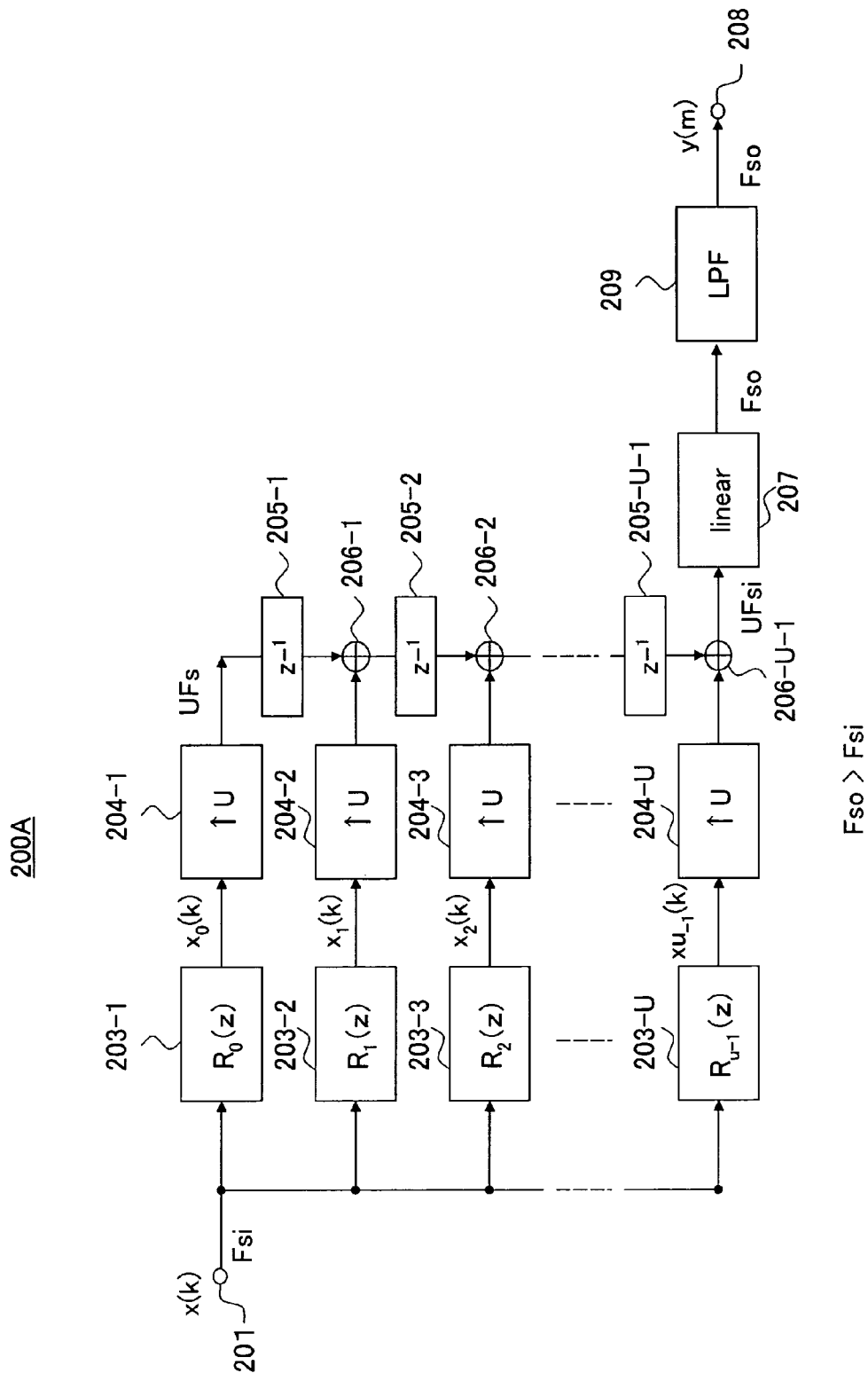
FIG. 16 is a view of the configuration showing a fourth embodiment of a sampling rate converter according to the present invention.

FIG. 16 is a view of the configuration showing a fourth embodiment of the sampling rate converter according to the present invention.

The difference of the fourth embodiment from the above-explained third embodiment resides in that an LPF 209 is provided between the linear interpolation block 207 and the output terminal 208 in place of providing the LPF 202 between the input terminal 201 and the convolution processing units 203-1 to 203-U, and the configuration is made so that generation of an imaging component where the sampling frequency Fsi of the input is lower than the sampling frequency Fso of the output and generation of a frequency component which does not exist in the original data are prevented (suppressed).

The rest of the configuration is the same as that of the third embodiment.

According to the fourth embodiment, in addition to the effects of the second embodiment explained above, there are the advantages that the amount of processing can be suppressed to the required lowest limit and an improvement of the processing speed can be achieved.

Note that it is also possible to provide the LPF 202 between the input terminal 201 and the convolution processing units 203-1 to 203-U and provide the LPF 209 between the linear interpolation block 207 and the output terminal 208.

Figure 17:
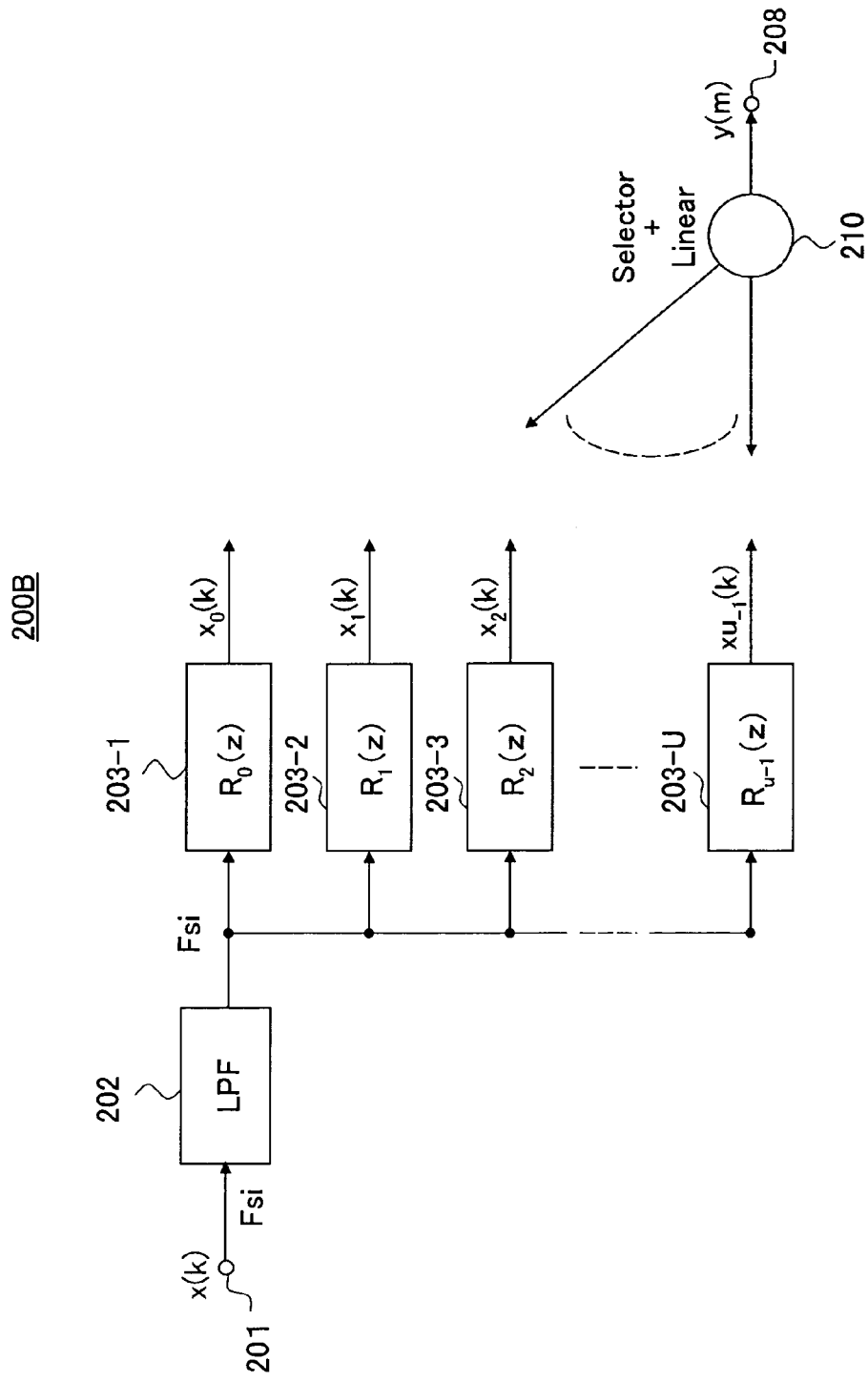
FIG. 17 is a view conceptually showing a fifth embodiment of a sampling rate converter according to the present invention.

FIG. 17 is a view conceptually showing a fifth embodiment of the sampling rate converter according to the present invention.

The difference of the fifth embodiment from the above-explained third embodiment resides in that the position of the sample required for the linear interpolation can be specified in the linear interpolation block, therefore, the configuration is made so that the linear interpolation block is regarded as a selector 210, the poly-phase filter coefficient set corresponding to the sample output by the selector 210 is selected, and the convolution processing of the poly-phases based on the above Equation (47) is carried out.

In this way, it is possible to regard the linear interpolation block as the selector 210, select the poly-phase filter corresponding to the output sample, and carry out only the convolution processing of the poly-phases of Equation (47).

By doing this, it becomes unnecessary to perform unnecessary computation.

The configuration of the sampling rate converter 200B in this case basically has, as shown in FIG. 17, an input terminal 201 to which a sample signal x(n) having a sampling frequency Fs is input, an LPF 202 for suppressing the generation of the aliasing component and the occurrence of folding when the sampling frequency Fsi of the input is higher than the sampling frequency Fso of the output, convolution processing units 203 (-1 to -n) for performing the convolution processing (Equation (47)) of the input samples and the poly-phase filters obtained by decomposing the filter to poly-phases, a selector 210 for selecting the poly-phase filter corresponding to the output sample, and an output terminal 208 for outputting the sample signal y(m) having the frequency converted to the desired sampling frequency.

Figure 18:
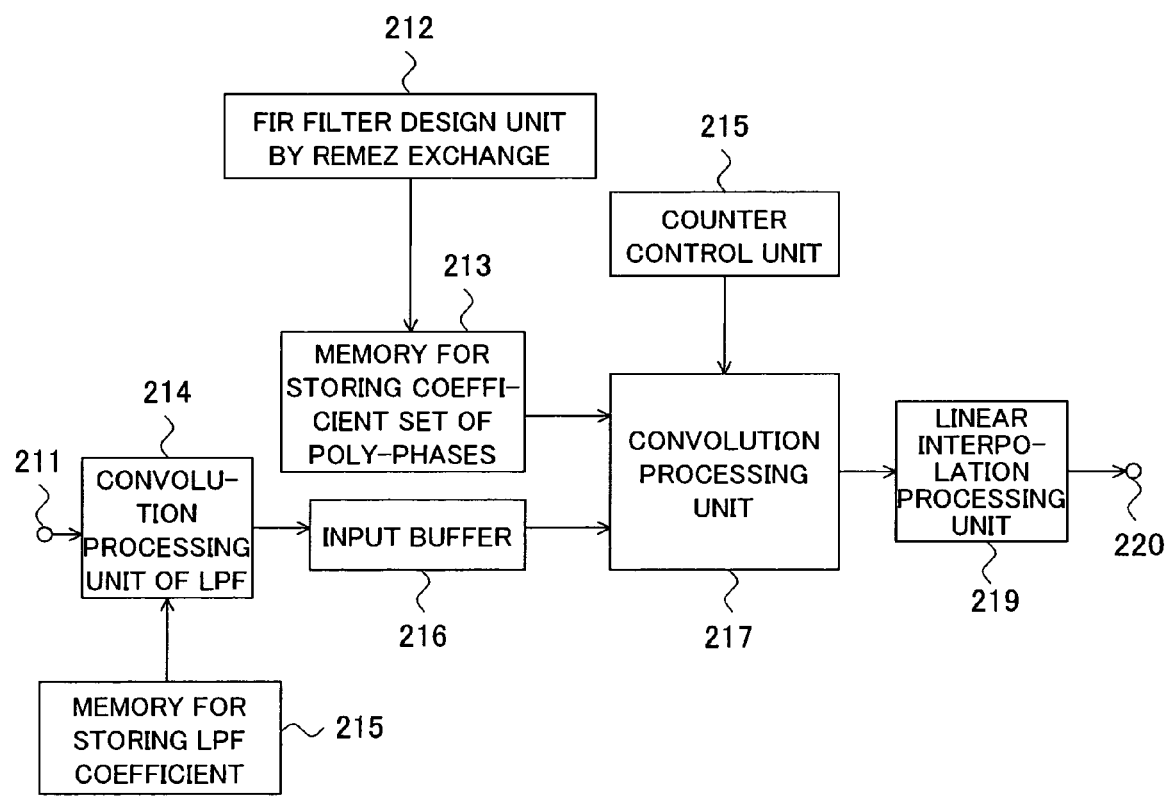
FIG. 18 is a view more specifically showing the sampling rate converter conceptually shown in FIG. 17.

FIG. 18 is a view more specifically showing the sampling rate converter 200B conceptually shown in FIG. 17.

This sampling rate converter 200C has, as shown in FIG. 18, an input terminal 211 to which the sample signal x(n) having the sampling frequency Fs is input, an FIR filter design unit 212 having a coefficient set based on the algorithm of FIG. 11 explained above, a first memory 213 for storing the coefficient set of the poly-phase filters by the FIR filter design unit 212, a convolution processing unit 214 for performing the convolution processing of the LPF for suppressing the generation of the aliasing component and the occurrence of folding when the sampling frequency Fsi of the input is higher than the sampling frequency Fso of the output, a second memory 215 for storing the LPF coefficient, an input buffer 216 for storing input data of the convolution processing unit 214, a convolution processing unit 217 for performing the convolution processing of the input data and the poly-phase filter decomposed to the poly-phases based on the input data stored in the input buffer 216 and the coefficient read out from the first coefficient memory 213, a counter control unit 218 having a role for selecting two points of samples required for the output sample and selecting the corresponding poly-phase filter and finding the coefficient of the linear interpolation, a linear interpolation processing unit 219 for finding the value at the required position from the output of the convolution processing unit 217 based on the coefficient of the linear interpolation by the counter control unit 218, and an output terminal 220 for outputting the sample signal converted in frequency to the desired sampling frequency.

The counter control unit 218 is included in the linear interpolation block and has a variable master counter (Master-Counter).

FIG. 19 is a view for explaining the variables used in the linear interpolation block.

As shown in FIG. 19, the linear interpolation block includes, as variables, a MasterCount as the master counter for determining the operation of the linear interpolation, a Count1000 as the counter of the decimal point or less to be added to the master counter, an added value of an integer portion to be added to the master counter, and a CountAmari as the added value of errors of the decimal point or less to be added to Count1000.

FIGS. 20A and 20B are views for specifically explaining the MasterCount.

MasterCount is comprised of at least 26 bits as shown in FIGS. 20A and 20B, in which the 16 bits from the 0-th bit to 15-th bit indicate the coefficient of the linear interpolation, the 7 bits from the 16-th bit to the 22nd bit indicate the number of the poly-phase coefficient set, and the 3 bits from the 23rd bit to the 25-th bit indicate the sample number to be read and fetched.

Sixth Embodiment

Figure 21:
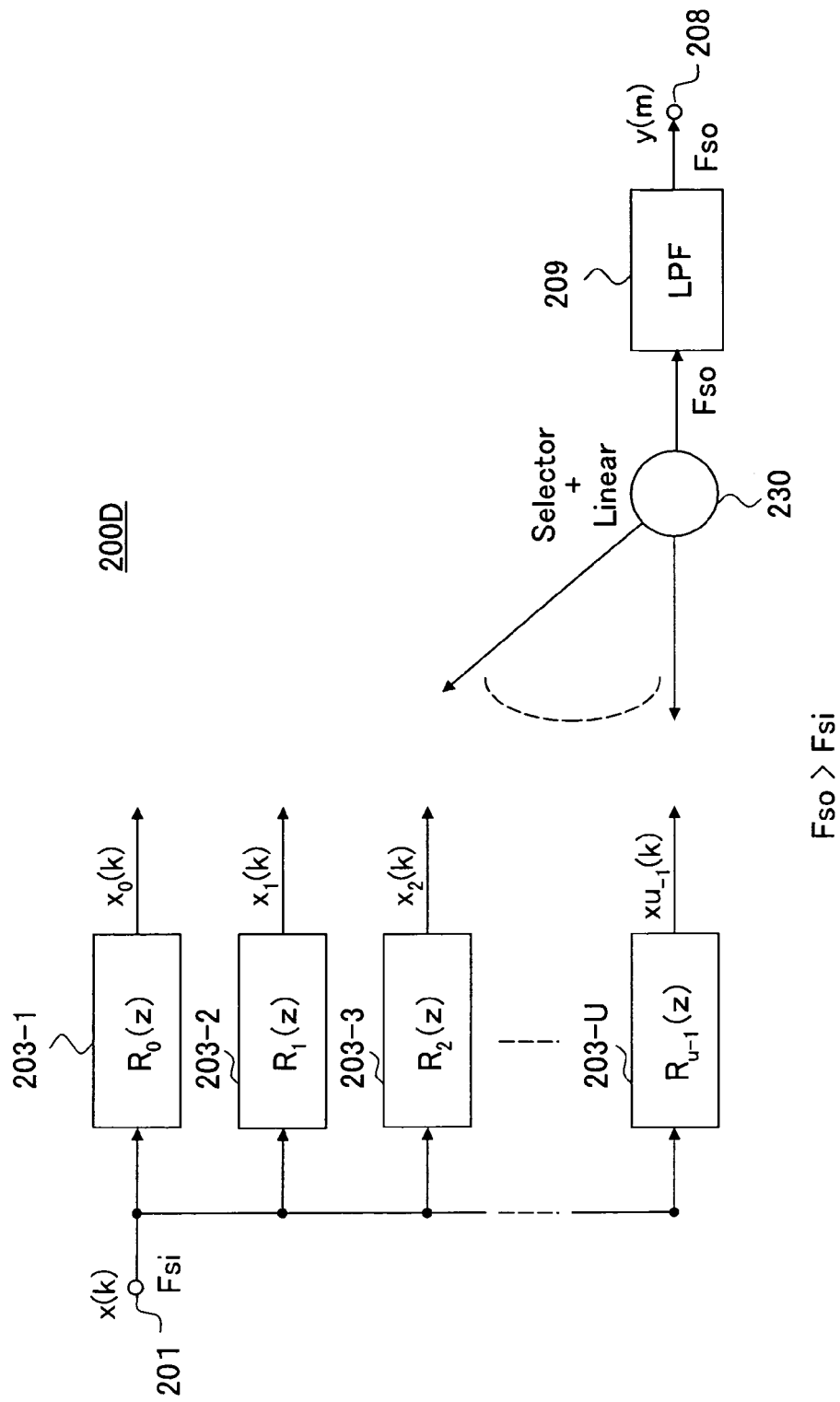
FIG. 21 is a view conceptually showing a sixth embodiment of a sampling rate converter according to the present invention.

FIG. 21 is a view conceptually showing a sixth embodiment of the sampling rate converter according to the present invention.

The difference of the sixth embodiment from the above fourth embodiment resides in the configuration that the position of the sample required for the linear interpolation can be specified in the linear interpolation block, therefore the linear interpolation block is regarded as the selector 230, the poly-phase filter coefficient set corresponding to the sample output by the selector 230 is selected, and the convolution processing of the poly-phases based on the above Equation (47) is carried out.

In this way, only the convolution processing of Equation (47) may be carried out by regarding the linear interpolation block as the selector 230 and selecting the poly-phase filter corresponding to the output sample.

By doing this, it becomes unnecessary to perform unnecessary computation.

The configuration of the sampling rate converter 200D in this case basically has, as shown in FIG. 21, an input terminal 201 to which a sample signal x(n) having a sampling frequency Fs is input, convolution processing units 203(-1 to -n) for performing the convolution processing (Equation (47)) of the input samples and the poly-phase filter decomposed to poly-phases, a selector 230 for selecting the poly-phase filter corresponding to the output sample, an LPF 209 for suppressing generation of the imaging component and occurrence of a frequency component not existing in the original data when the sampling frequency Fsi of the input is lower than the sampling frequency Fso of the output, and an output terminal 208 for outputting a sample signal y(m) having a frequency converted to the desired sampling frequency.

Figure 22:
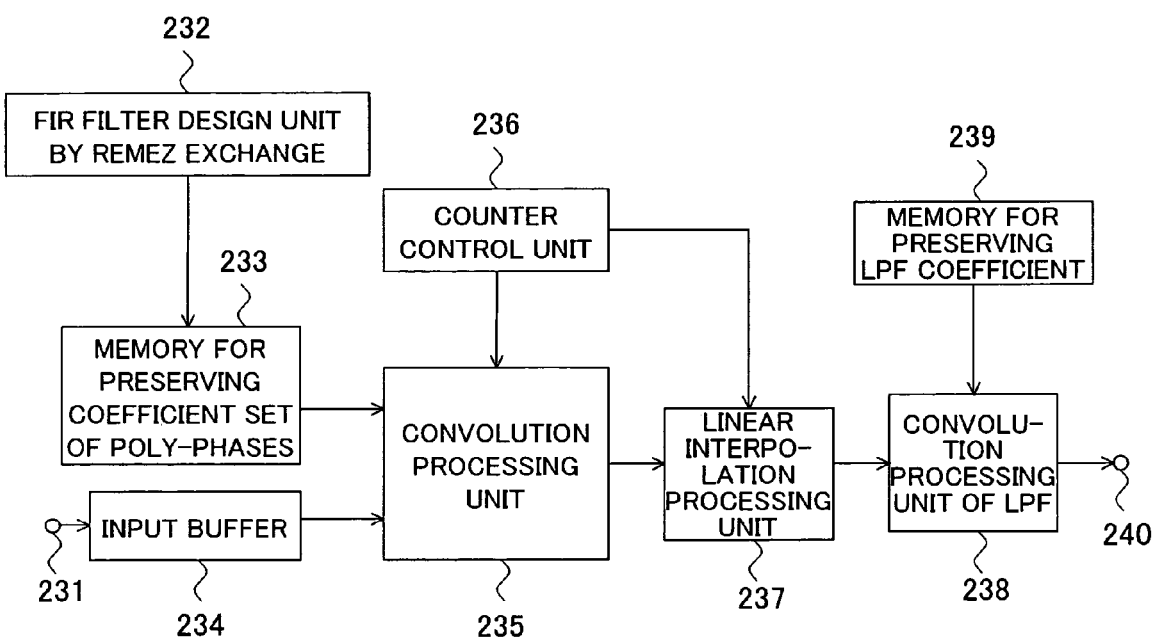
FIG. 22 is a view more specifically showing the sampling rate converter conceptually shown in FIG. 21.

FIG. 22 is a view more specifically showing the sampling rate converter 200D conceptually shown in FIG.

This sampling rate converter 200E has, as shown in FIG. 18, an input terminal 231 to which a sample signal x(n) having a sampling frequency Fs is input, an FIR filter design unit 232 having a coefficient set based on the algorithm of FIG. 11 explained above, a first memory 233 for storing the coefficient set of the poly-phase filters by the FIR filter design unit 232, an input buffer 234 for storing the input data of the convolution processing unit 235, a convolution processing unit 235 for performing the convolution processing of the input data and the poly-phase filter decomposed to poly-phases based on the input data stored in the input buffer 234 and the coefficient read out from the first coefficient memory 233, a counter control unit 236 having a role of selecting two points of samples required for the output sample and selecting the corresponding poly-phase filter and finding the coefficient of the linear interpolation, a linear interpolation processing unit 237 for finding the value at the required position from the output of the convolution processing unit 235 based on the coefficient of the linear interpolation by the counter control unit 236, a convolution processing unit 238 for performing the convolution processing of the LPF for suppressing the generation of an imaging component and the generation of a frequency component not existing in the original data when the samplingfrequeny Fsi of the input is lower than the sampling frequency Fso of the output, a second memory 239 for storing the LPF coefficient, and an output terminal 240 for outputting the sample signal converted in frequency to the desired sampling frequency.

Note that the concrete nature of the counter control unit 236 is the same as that explained with reference to FIG. 19, and FIGS. 20A and 20B.

Below, an explanation will be given of the mounting method and a specific example of the sampling rate converter according to the embodiments in sequence.

Here, an explanation will be given of the mounting method and a specific example of the sampling rate converter of FIG. 5, FIG. 17, and FIG. 18 and the mounting method and a specific example of the sampling rate converter of FIG. 14, FIG. 21, and FIG. 22 in sequence.

<Mounting Method of Sampling Rate Converter (FIG. 5, FIG. 17, FIG. 18)>

When realizing the sampling rate converter shown in FIG. 5, it is realized by using the poly-phase configuration shown in FIG. 17. In the method of realization explained below, the required smallest computation is satisfactory by selecting the required input with respect to the output and selecting the poly-phase filter.

Figure 23:
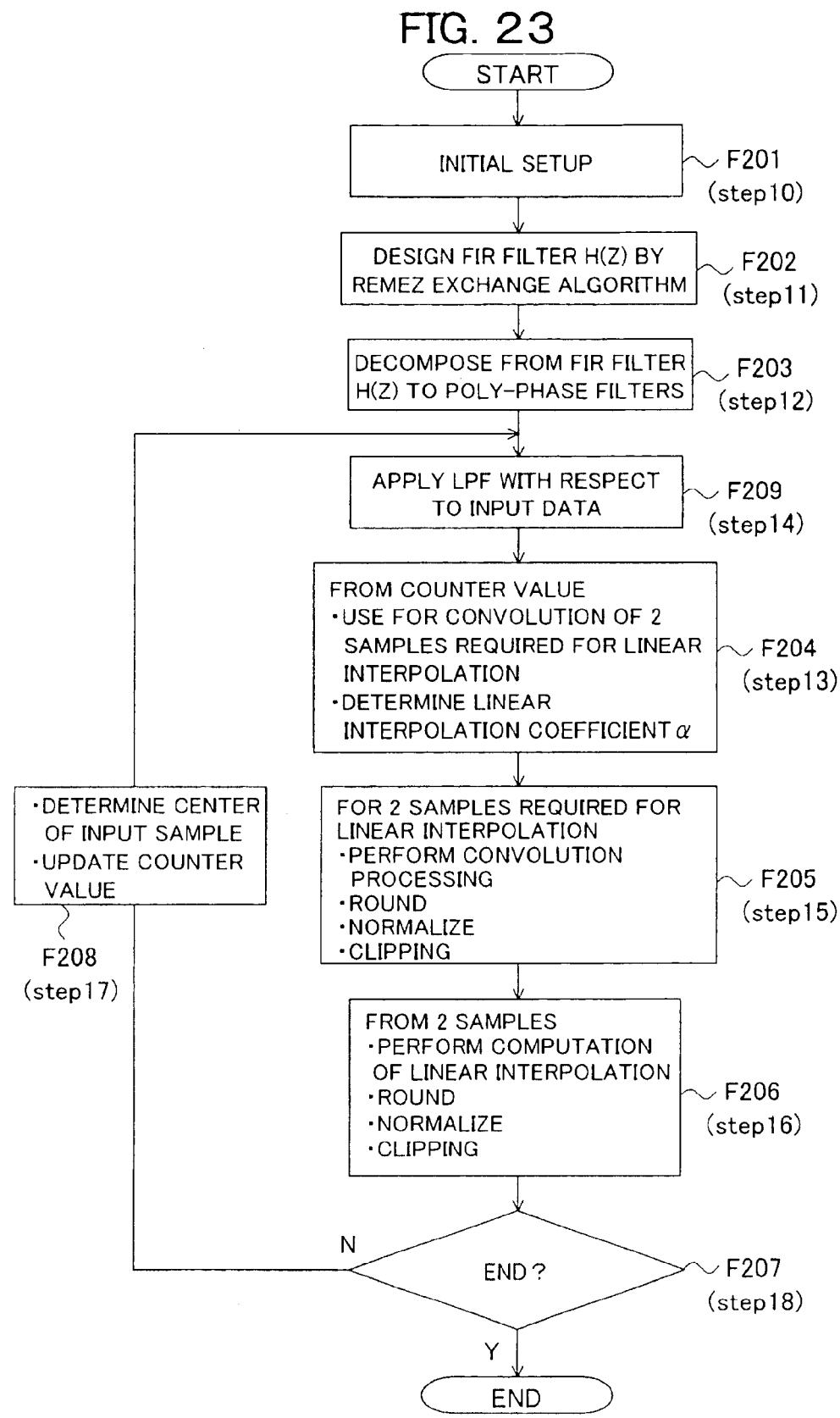
FIG. 23 is a flow chart for explaining a first mounting method of a sampling rate converter according to the present embodiment.

FIG. 23 is a flow chart for explaining the mounting method of the sampling rate converter according to the present embodiment.

The specific processing becomes as follows. Note that, for convenience of the explanation, C language-like expressions are used, but does not matter if the mounting means is hardware, software, or a mixture of hardware and software.

<Step 10>

As shown in FIG. 23, first, the initial setup is carried out (F201). In this initial setup, the number of input data, the number of output data, the center of the input data, the number of taps of the poly-phase filter, and the number of the coefficient set of the poly-phase filters are set. Specifically, the initial value of the counter control unit 215 is set.

They are specifically as follows.

'Input data number: InputSample;

'Number of taps: Tap;

'Center of input data: InputOffset=0;

'Number of taps of poly-phase filter: PolyTap=(Tap+Up−1) /Up;

'Number of coefficient set of poly-phase filter: Coeff Count; and

'Linear interpolation block:

The method of finding CountAdd and CountAmari is defined from the sampling frequency Fsi of the input and the sampling frequency Fso of the output.

Only integer portion*/

CountAdd=(int) (Fso/Fsi*2^23);

1000 ties of decimal point or less*/

CountAmari=( (Fso/Fsi*2^23)−CountAdd) *1000;

When the frequency is converted from 44.1 kHz to 48 kHz, it specifically becomes as follows:

Example: Convert 44.1 kHz → 48 kHz*/

CountAdd=9130457;

CountAmari=687;

The initial value of Count1000 is determined as follows.

Count1000=500;/*for rounding*/

<Step 11>

Next, the low pass FIR filter is designed by the Remez Exchange algorithm already explained with reference to for example FIG. 11 (F202).

Here, a detailed description thereof will be omitted.

<Step 12>

Next, the poly-phase filter is prepared (F203). Namely, from the transmission function H(z) of the FIR filter, the transmission function Ri(z) of the poly-phase filter is found by using a development equation of the above Equation (42). above Equation (42).

As in the following equataion, a normalization coefficient $R_{iNormal}$ of each poly-phase is found.

[Equation 48]

$$R_{iNormal} = \sum_{k=0}^{PolyTap-1} Coef(k) \qquad (48)$$

Then, coefficient inversion for convolution is carried out. Namely, in order to perform the convolution of above Equation (47), the coefficients of the poly-phase filters are rearranged to an inverse sequence.

So the positon of the center if the tape becomes the first output*/

It is necessary to select the set of corefficients.

*/

CoeffCount= (PolyTap*/Up/2) %Up;

Set initial value of MasterCount. */

Number of coefficient set of poly-phases including the center value of MasterCount=H (z)

CoeffCount)<<16:

Note that, <<16 indicates a 16-bit shift.

<Step 13>

Next, the poly-phase filter and the center of input are determined (F204).

The coefficient LinearCoef of the linear interpolation and the number CoefCount of the coefficient set of the poly-phases are found as follows:

<Step 14>

Filter processing by the low pass filter LPF is carried out (F209).

Specifically, after the convolution is carried out as in Equation (49) and rounded as in Equation (50) next, it is normalized as in Equation (51), then the clipping is carried out as in Equation (52).

[Equation 49]

Convolution (49)

$$Yconv = \sum_{k=0}^{LPFTap-1} LPF(k) \times x(InputOffset) + k - LPFT_{ap}/2$$

[Equation 50]

Rounding off (50)

$$y_{tmp} = \begin{cases} Yconv + (LPF_{Normal}/2) & Yconv \geq 0 \\ Yconv - (LPF_{Normal}/2) & Yconv < 0 \end{cases}$$

[Equation 51]

Normalization (51)

$$Y_{Normal} = Y_{tmp} / LPF_{Normal}$$

[Equation 52]

Clipping (52)

$$Src(n) = \begin{cases} CLIP\_MAX & Y_{Normal} \geq CLIP\_MAX \\ CLIP\_MIN & Y_{Normal} \leq CLIP\_MIN \\ Y_{Normal} & else \end{cases}$$

In case of 16 bits, CLIP MAX=32767 and CLIP MIN=32768 stand.

In the case of 24 bits, CLIP MAX=8388607 and CLIP MIN=8388608 stand.

In the case of signed 8 bits, CLIP MAX=127 and CLIP MIN=128 stand.

In the case of unsigned 8 bits, CLIP MAX=255 and CLIP MIN=0 stand.

<Step 15>

Next, the convolution of the above Equation (47) is carried out (F205).

Two points of samples required in the linear interpolation block are found. In the computation of the convolution, numbers of the coefficient set of poly-phases and the center of the input data are computed by using the following values for a left sample InA and a right sample InB as shown in Table 4.

TABLE 4

| Output | Number of poly-phase coefficient set | Center of input data | Remarks |
|---|---|---|---|
| InA | CoefCount | InputOffset | |
| InB | (CoefCount + 1) 0 | InputOffset InputOffset + 1 | Time of (CoefCount + 1) < 128 Time of (CoefCount + 1) = 128 |

Specifically, after the convolution is carried out as in Equation (53) and the result rounded off as in Equation (54), the result is normalized as in Equation (55), then clipped as in Equation (56).

[Equation 53]

Convolution (53)

$$In_{conv} = \sum_{k=0}^{PolyTap-1} CoefCount(k) \times Src(InputOffset + (k - PolyTap/2))$$

[Equation 54]

Rounding off (54)

$$In_{tap} = \begin{cases} In_{conv} + (R_{Normal}/2) & x_{conv} \geq 0 \\ In_{conv} - (R_{Normal}/2) & x_{conv} < 0 \end{cases}$$

[Equation 55]

Normalization (55)

$$In_{Normal} = In_{Tap} / R_{Normal}$$

[Equation 56]

Clipping (56)

$$In = \begin{cases} CLIP\_MAX & In_{Normal} \geq CLIP\_MAX \\ CLIP\_MIN & In_{Normal} \leq CLIP\_MIN \\ In_{Normal} & else \end{cases}$$

In the case of 16 bits, CLIP MAX=32767 and CLIP MIN=32768 stand.

In the case of 24 bits, CLIP MAX=8388607 and CLIP MIN=8388608 stand.

In the case of signed 8 bits, CLIP MAX=127 and CLIP MIN=128 stand.

In the case of unsigned 8 bits, CLIP MAX=255 and CLIP MIN=0 stand.

<Step 16>

Next, linear interpolation is carried out (F206).

The linear interpolation of one sample is carried out as follows.

```
    Minus minimum value of PCM 24bit*/
#define SRC PCM 24BIT MINUS-8388608
Plus maximum value of PCM 24bit*/
#define SRC PCM 24BIT PLUS 8388607
Maximum value of Alpha, Beta coefficients of Linear Up128*/
#define SRC LINEAR MAX COEF 65535
Rounding of 16 bit of linear interpolation*/
#define SRC LINEAR NORMAL 32768
Shift amount of 16 bit of linear interpolation*/
#define SRC LINEAR SHIFT 16
    Perform 1 sample of linear interpolation
        alpha, /*16 bit input*/
        IN A, /*24 bit input*/
        IN B, /*24 bit input*/
        OUT Y/*24 bit output*/
lldata=alpha*IN B+(SRC LINEAR MAX COEF-alpha)*/ IN A;
/*Rounding*/
if(lldata>=0)lldata+=(SRC LINEAR NORMAL);
else lldata-=(SRC LINEAR NORMAL);
/*Normalize*/
Out Ya=(lldata>>SRC LINEAR SHIFT);
Clipping*/
Y(n)=(Out Ya<SRC PCM 24BIT MINUS)?SRC PCM 24BIT
```

MINUS
: ((Out Ya>SRC PCM 24BIT PLUS)?SRC PCM 24BIT PLUS:
Out Ya);
<Step 17>
Update the counter value and the center of sample (F208).
The MasterCount and the sample number Readsample to be read are updated as follows.
  Add Count Value to control Master Counter */
  MasterCount+=CountAdd;
  Remainder off decimal point or less*/1000 times */
  Count1000+=CountAmari;
  if(Count1000 >=1000) {
  MasterCount+=1;
  Count1000-=1000;
  }
  InputOffset+=((MasterCount)>>23) &0x00000007;
  MasterCount=MasterCount&0x007fffff;
  Step 18>
Here, a judgment of whether or not the end condition is satisfied is carried out (F207). When the condition is satisfied, the processing is ended. When it is not satisfied, the routine returns to the processing of F208 and F209.

Next, an explanation will be given of the mounting method and a specific example of the sampling rate converter of FIG. 14, FIG. 21, and FIG. 22.

<Mounting Method of Sampling Rate Converter (FIG. 14, FIG. 21, and FIG. 22)>

When realizing the sampling rate converter shown in FIG. 14, it is realized by using the poly-phase configuration shown in FIG. 21. In the method explained below, the required smallest computation is satisfactory by selecting the required input with respect to the output and the poly-phase filter.

Figure 24:
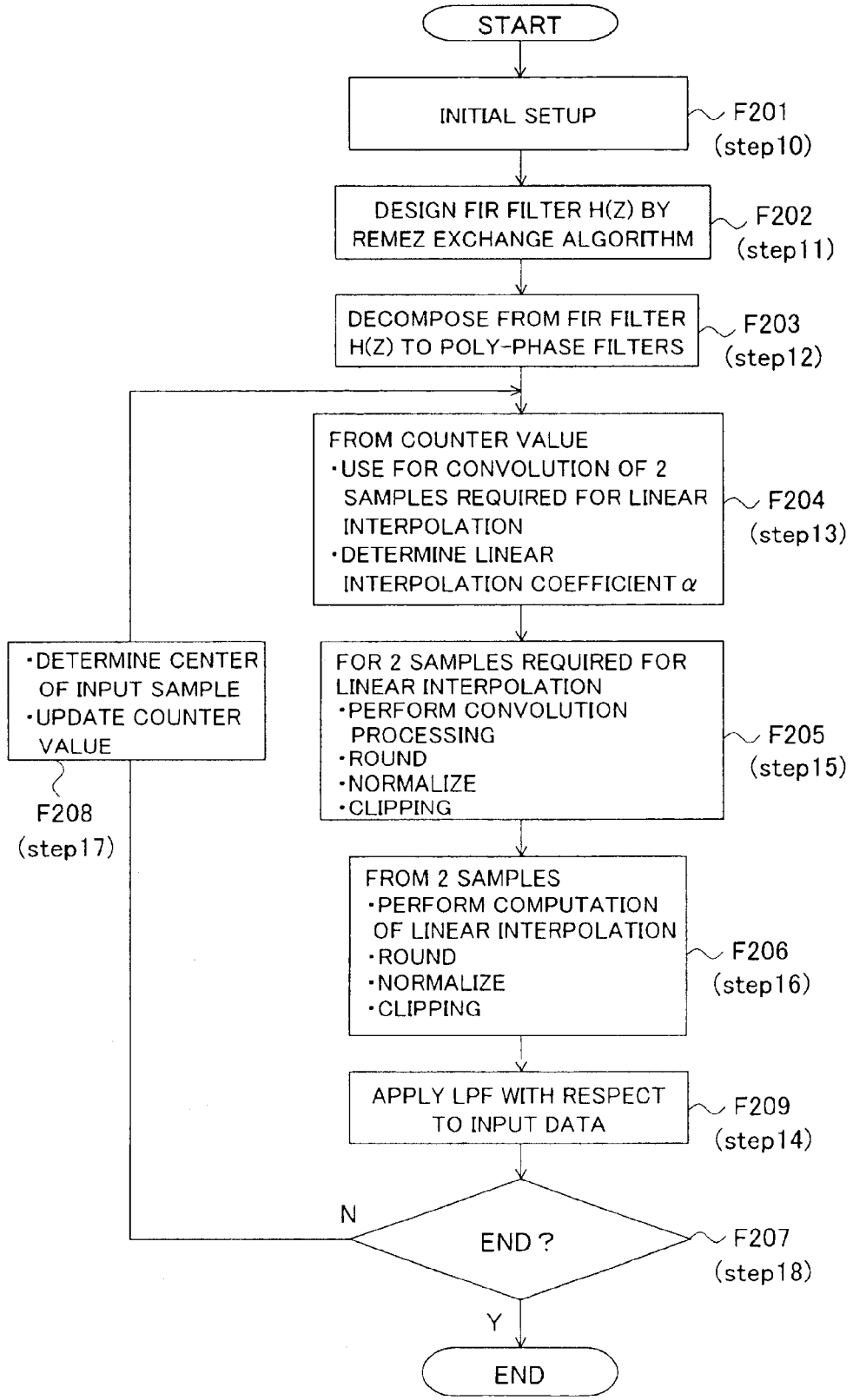
FIG. 24 is a flow chart for explaining a second mounting method of a sampling rate converter according to the present embodiment.

FIG. 24 is a flow chart for explaining the mounting method of the sampling rate converter according to the present embodiment.

The specific processing becomes as follows. Note that, for convenience of the explanation, C language-like expressions are used, but does not matter if the mounting means is hardware, software, or a mixture of hardware and software.

The processing of FIG. 24 is the same as the processing of FIG. 23 except the processing of F209 in the processing of FIG. 23 is carried out after the processing of F206.

The contents of the processing in the steps are the same as the contents explained with reference to FIG. 23, so overlapping explanations are omitted here.

Seventh Embodiment

As a seventh embodiment, an explanation will be given of an audio apparatus employing each above sampling rate converter.

Figure 25:
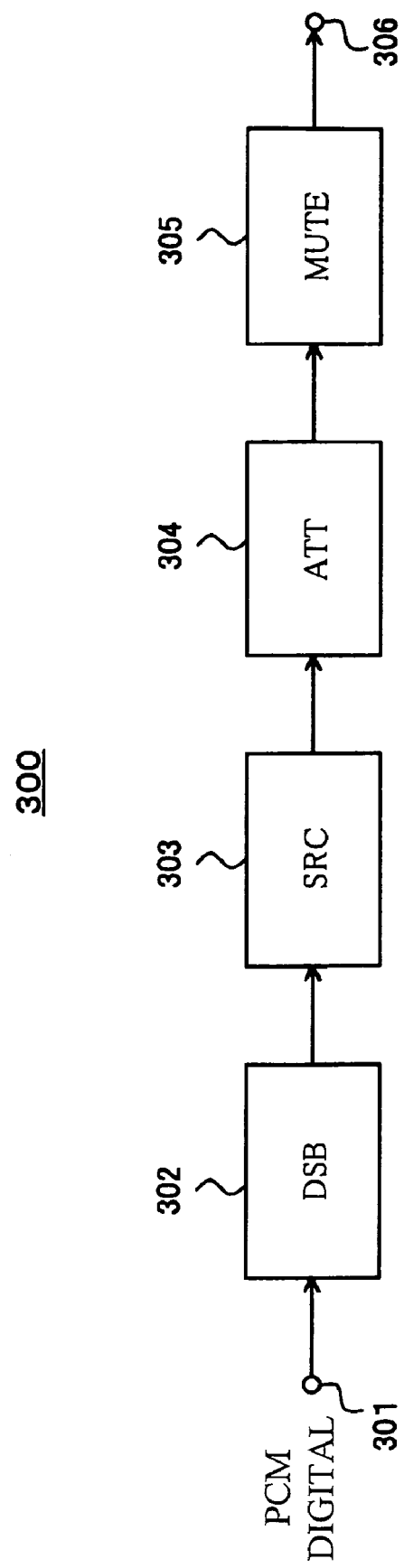
FIG. 25 is a block diagram showing an example of the configuration of an audio apparatus employing the sampling rate converter according to the present invention.

FIG. 25 is a block diagram showing an example of the configuration of an audio apparatus employing a sampling rate converter according to the present invention.

The audio apparatus 300 has an input terminal 301, LR separation circuit (DSB) 302, sampling rate converter (SRC) 303, attenuator (ATT) 304, mute circuit (MUTE) 305, and output terminal 306.

As the sampling rate converter (SRC) 303, sampling rate converters 100, 100A, 200, and 200A to 200E explained with reference to FIG. 5, FIG. 14, FIG. 17, FIG. 18, FIG. 21, and FIG. 22 as the above-explained first to sixth embodiments are applied.

In this case, as exceptions to the above-explained explanation, the following processings are carried out.

End point processing is carried out. Namely, when a first filter computation is carried out, there is a shortage of Tap/2 samples. 0 is supplemented for the Tap/2 samples.

Further, holding processing of previous data is carried out. As the processing peculiar to audio, it is necessary to copy the input data for the next filter computation after applying a filter with respect to Width as follows.

[Equation 57]

$$Src(i)=Src(\text{Width}+i), i=0,\ldots,\text{Tap}-1 \qquad (57)$$

In this auidio apparatus 300, for example a PCM digital signal of 48 kHz input from the input terminal 301 is subjected to a predetermined separating at a separation circuit 302, then the sampling rate is converted at the sampling rate converter 303, and the result is output as for example a signal of 44.1 kHz.

Then, attenuation processing is applied at the attenuator 304, and further the PCM digital audio signal is output from the output terminal 306 via the mute circuit 305.

According to the audio apparatus 300, since it has a sampling rate converter in which chessboard distortion is avoided, any pre-filter can be considered, any frequency point can be passed, and the amount of processing can be suppressed to the required lowest limit, there are the advantages that the noise tolerance is improved, the deviation of the linear gain can be avoided, and an improvement of the processing speed can be achieved.

Eighth Embodiment

As an eighth embodiment, an explanation will be given of an image processing apparatus employing a sampling rate converter.

In the conversion of resolution of an image utilizing sampling rate conversion for the application of the filter processing using the linear phase FIR filter, use is made of a multi-rate filter using an interpolator, a decimeter, and a linear phase FIR filter as element technologies.

In this case, the end point processing is carried out. As processings of both ends, processings such that the zero is supplemented first, the reflected (Mirror) data is input second, and pixels of both ends are held third are carried out.

Further, the initialization processing is carried out. Specifically, after performing the processing up to the end of the image, CoefCount=0 is initialized.

According to the present image processing apparatus, since it has a sampling rate converter in which chessboard distortion is avoided, any pre-filter can be considered, any frequency point can be passed, and it is possible to suppress the amount of processing to the required lowest limit, there are the advantages that the image does not exhibit a lattice state, deviation of the linear gain can be avoided, and an improvement of the processing speed can be achieved.

INDUSTRIAL APPLICABILITY

According to the present invention, an amplitude characteristic that passes any frequency can be obtained, and high precision conversion can be accomplished without regard as to the cutoff frequency, therefore the present invention can be applied to for example conversion of the sampling frequency of audio and conversion of resolution such as magnification or reduction of the frame of images.

The invention claimed is:

1. A sampling rate converter comprising:
an up sampler for receiving an input signal at frequency Fsi and for inserting U-1 zero points between sample signals and raising a sampling frequency U-fold to output an output signal at frequency UFsi, a convolution processing unit including an FIR filter and performing predetermined convolution processing with respect to the output signal of the up sampler, a linear interpolation block for selecting two points of samples with respect to the results of processing of the convolution processing unit and finding a value at a required position from the linear interpolation, and a low pass filter providing either low pass filtered sample signals to the up sampler, or low pass filtering signals output of the linear interpolation block, wherein the FIR filter of the convolution processing unit is an FIR filter where an impulse response is expressed by a finite time length, the impulse response becomes a filter coefficient, and a transmission function H(z) is associated with a transmission function Z(z) of the low pass filter, and the filter coefficient is set by performing weighted approximation with respect to a desired characteristic in relation to a frequency response of the low pass filter.

2. A sampling rate converter as set forth in claim 1, wherein the filter coefficient is set based on an amplitude characteristic of an equalizer obtained by performing weighted approximation with respect to a desired characteristic in relation to a frequency response of the low pass filter.

3. A sampling rate converter as set forth in claim 1, wherein the weighted approximation is performed with respect to a desired characteristic using a Remex Exchange algorithm considering a frequency response of the low pass filter.

4. A sampling rate converter as set forth in claim 1, wherein the low pass filter prevents an aliasing component from occurring and folding from occurring when the sampling frequency of the input is lower than a sampling frequency of the output.

5. A sampling rate converter as set forth in claim 1, wherein the low pass filter prevents an imaging component from occurring and a non-original frequency component from occurring when the sampling frequency of the input is higher than a sampling frequency of the output.

6. A sampling rate converter comprising:
an up sampler for receiving an input signal at frequency Fsi and for inserting U-1 zero points between sample signals and raising a sampling frequency U-fold to output an output signal at frequency UFsi, a convolution processing unit including an FIR filter and performing predetermined convolution processing with respect to the output signal of the up sampler, a linear interpolation block for selecting two points of samples with respect to the results of processing of the convolution processing unit and finding a value at a required position from the linear interpolation, and a low pass filter providing either low pass filtered sample signals to the up sampler, or low pass filtering signals output of the linear interpolation block, wherein the FIR filter of the convolution processing unit is an FIR filter where an impulse response is expressed by a finite time length, and the impulse response becomes a filter coefficient, and the filter coefficient is set by performing weighted approximation with respect to a desired characteristic using an algorithm adding a restrictive condition so as to pass any frequency point.

7. A sampling rate converter as set forth in claim 6, wherein the weighted approximation is performed with respect to a desired characteristic using a Remex Exchange algorithm passing any frequency point.

8. A sampling rate converter as set forth in claim 6, wherein the low pass filter prevents an aliasing component from occurring and folding from occurring when the sampling frequency of the input is lower than a sampling frequency of the output.

9. A sampling rate converter as set forth in claim 6, wherein the low pass filter prevents an imaging component from occurring and a non-original frequency component from occurring when the sampling frequency of the input is higher than a sampling frequency of the output.

10. A sampling rate converter comprising:
an up sampler for receiving an input signal at frequency Fsi and for inserting U-1 zero points between sample signals and raising a sampling frequency U-fold to output an output signal at frequency UFsi, a convolution processing unit including an FIR filter and performing predetermined convolution processing with respect to the output signal of the up sampler, a linear interpolation block for selecting two points of samples with respect to the results of processing of the convolution processing unit and finding a value at a required position from the linear interpolation, and a low pass filter providing either low pass filtered sample signals to the up sampler, or low pass filtering signals output of the linear interpolation block, wherein the FIR filter of the convolution processing unit is an FIR filter where an impulse response is expressed by a finite time length, the impulse response becomes a filter coefficient, and a transmission function H(z) is associated with a transmission function Z(z) of the low pass filter, and the filter coefficient is set by performing weighted approximation with respect to a desired characteristic in relation to frequency points to be passed and a frequency response of the low pass filter.

11. A sampling rate converter as set forth in claim 10, wherein the filter coefficient is set based on an amplitude characteristic of an equalizer obtained by performing weighted approximation with respect to a desired characteristic in relation to frequency points to be passed and a frequency response of the low pass filter.

12. A sampling rate converter as set forth in claim 10, wherein the weighted approximation is performed with respect to a desired characteristic using a Remex Exchange algorithm passing any frequency point and considering a frequency response of the low pass filter.

13. A sampling rate converter as set forth in claim 10, wherein the low pass filter prevents an aliasing component from occurring and folding from occurring when the sampling frequency of the input is lower than a sampling frequency of the output.

14. A sampling rate converter as set forth in claim 10, wherein the low pass filter prevents an imaging component from occurring and a non-original frequency component from occurring when the sampling frequency of the input is higher than a sampling frequency of the output.

15. A sampling rate converter comprising:
a plurality of convolution processing units including pre-phase filters obtained by poly-phase decomposing a pre-determined FIR filter and performing the convolution processing of input sample signals and the poly-phase filters decomposed to the poly-phases, a plurality of up samplers for receiving input signals at frequency Fsi and for inserting U-1 zero points between output signals of corresponding convolution processing units and raising the sampling frequency U-fold to output output signals at frequency UFsi, an adding means for generating a signal after adding all signals by adjusting a propagation time of the output signals of the plurality of up samplers, a linear interpolation block for selecting two points of samples with respect to the signal by the adding means and finding the value at the required position from the linear interpolation, and a low pass filter providing either low pass filtered signals to the plurality of up samplers, or low pass filtering signals output of the linear interpolation block, wherein the FIR filter is an impulse response is expressed by a finite time length, the impulse response becomes the filter coefficient, and a transmission function H(z) is associated with a transmission function Z(z) of the low pass filter, and the filter coefficient is set by performing weighted approximation with respect to a desired characteristic in relation to a frequency response of the low pass filter.

16. A sampling rate converter as set forth in claim 15, wherein the filter coefficient is set based on an amplitude characteristic of an equalizer obtained by performing weighted approximation with respect to a desired characteristic in relation to a frequency response of the low pass filter.

17. A sampling rate converter as set forth in claim 15, wherein the weighted approximation is performed with respect to a desired characteristic using a Remex Exchange algorithm considering a frequency response of the low pass filter.

18. A sampling rate converter as set forth in claim 15, wherein the low pass filter prevents an aliasing component from occurring and folding from occurring when the sampling frequency of the input is lower than a sampling frequency of the output.

19. A sampling rate converter as set forth in claim 15, wherein the low pass filter prevents an imaging component from occurring and a non-original frequency component from occurring when the sampling frequency of the input is higher than a sampling frequency of the output.

20. A sampling rate converter comprising:

a plurality of convolution processing units including pre-phase filters obtained by poly-phase decomposing a predetermined FIR filter and performing convolution processing of input sample signals and poly-phase filters decomposed to poly-phases, a plurality of up samplers for receiving input signals at frequency Fsi and for inserting U-1 zero points between output signals of corresponding the convolution processing units and raising the sampling frequency U-fold to output output signals at frequency UFsi, an adding means for generating a signal after adding all signals by adjusting a propagation time of the output signals of the plurality of up samplers, a linear interpolation block for selecting two points of samples with respect to the signal by the adding means and finding the value at the required position from linear interpolation, and a low pass filter providing either low pass filtered signals to the plurality of up samplers, or low pass filtering signals output of the linear interpolation block, wherein the FIR filter is an FIR filter where an impulse response is expressed by a finite time length, and an impulse response becomes the filter coefficient, and the filter coefficient is set by performing the weighted approximation with respect to a desired characteristic using an algorithm adding a restrictive condition so as to pass any frequency point.

21. A sampling rate converter as set forth in claim 20, wherein the weighted approximation is performed with respect to a desired characteristic using a Remex Exchange algorithm passing any frequency point.

22. A sampling rate converter as set forth in claim 20, wherein the low pass filter prevents an aliasing component from occurring and folding from occurring when the sampling frequency of the input is lower than a sampling frequency of the output.

23. A sampling rate converter as set forth in claim 20, wherein the low pass filter prevents an imaging component from occurring and a non-original frequency component from occurring when the sampling frequency of the input is higher than a sampling frequency of the output.

24. A sampling rate converter comprising:

a plurality of convolution processing units including pre-phase filters obtained by poly-phase decomposing a predetermined FIR filter and performing convolution processing of input sample signals and poly-phase filters decomposed to poly-phases, a plurality of up samplers for receiving input signals at frequency Fsi and for inserting U-1 zero points between output signals of corresponding convolution processing units and raising the sampling frequency U-fold to output output signals at frequency UFsi, an adding means for generating a signal after adding all signals by adjusting a propagation time of the output signals of the plurality of up samplers, a linear interpolation block for selecting two points of samples with respect to the signal by the adding means and finding the value at the required position from linear interpolation, and a low pass filter providing either low pass filtered sample signals to the plurality of up samplers, or low pass filtering signals output of the linear interpolation block, wherein the FIR is an FIR filter where an impulse response is expressed by a finite time length, an impulse response becomes the filter coefficient, and a transmission function H(z) is associated with a transmission function Z(z) of the low pass filter, and the filter coefficient is set by performing weighted approximation with respect to a desired characteristic in relation to frequency points to be passed and a frequency response of the low pass filter.

25. A sampling rate converter as set forth in claim 24, wherein the filter coefficient is set based on an amplitude characteristic of an equalizer obtained by performing weighted approximation with respect to a desired characteristic in relation to frequency points to be passed and a frequency response of the low pass filter.

26. A sampling rate converter as set forth in claim 24, wherein the weighted approximation is performed with respect to a desired characteristic using a Remex Exchange algorithm passing any frequency point and considering a frequency response of the low pass filter.

27. A sampling rate converter as set forth in claim 24, wherein the low pass filter prevents an aliasing component from occurring and folding from occurring when the sampling frequency of the input is lower than a sampling frequency of the output.

28. A sampling rate converter as set forth in claim 24, wherein the low pass filter prevents an imaging component from occurring and a non-original frequency component from occurring where the sampling frequency of the input is higher than a sampling frequency of the output.

29. A sampling rate converter comprising:
- an up sampler for receiving an input signal at frequency Fsi and for inserting U-1 zero points between sample signals and raising a sampling frequency U-fold to output an output signal at frequency UFsi,
- a convolution processing unit including poly-phase filters able to set different filter coefficients obtained by poly-phase decomposing a predetermined FIR filter and performing convolution processing of input sample signals and a poly-phase filter having a selected coefficient,
- a selector for selecting two points of samples required for an output sample and selecting the coefficient of the corresponding poly-phase filter,
- a linear interpolation block for finding the value at the required position from linear interpolation, and
- a low pass filter providing either low pass filtered signals to the convolution processing unit, or low pass filtering signals output of the linear interpolation block, wherein
- the FIR filter is an FIR filter where an impulse response is expressed by a finite time length, the impulse response becomes the filter coefficient, and a transmission function H(z) is associated with a transmission function Z(z) of the low pass filter, and
- the filter coefficient is set by performing weighted approximation with respect to a desired characteristic in relation to a frequency response of the low pass filter.

30. A sampling rate converter as set forth in claim 29, wherein the filter coefficient is set based on an amplitude characteristic of an equalizer obtained by performing weighted approximation with respect to a desired characteristic in relation to a frequency response of the low pass filter.

31. A sampling rate converter as set forth in claim 29, wherein the weighted approximation is performed with respect to a desired characteristic using a Remex Exchange algorithm considering a frequency response of the low pass filter.

32. A sampling rate converter as set forth in claim 29, wherein the low pass filter prevents an aliasing component from occurring and folding from occurring when the sampling frequency of the input is lower than a sampling frequency of the output.

33. A sampling rate converter as set forth in claim 29, wherein the low pass filter prevents an imaging component from occurring and a non-original frequency component from occurring when the sampling frequency of the input is higher than a sampling frequency of the output.

34. A sampling rate converter as set forth in claim 29, wherein the selector includes a counter by which at least a coefficient of linear interpolation, a number of a coefficient set of poly-phases, and a number of input samples are found.

35. A sampling rate converter comprising:
- an up sampler for receiving an input signal at frequency Fsi and for inserting U-1 zero points between sample signals and raising a sampling frequency U-fold to output an output signal at frequency UFsi,
- a convolution processing unit including poly-phase filters able to set different filter coefficients obtained by poly-phase decomposing a predetermined FIR filter and performing convolution processing of input sample signals and a poly-phase filter having a selected coefficient,
- a selector for selecting two points of samples required for an output sample and selecting the coefficient of the corresponding poly-phase filter,
- a linear interpolation block for finding the value at the required position from linear interpolation, and
- a low pass filter providing either low pass filtered signals to the convolution processing unit, or low pass filtering signals output of the linear interpolation block, wherein
- the FIR filter is an FIR filter where an impulse response is expressed by a finite time length, and the impulse response becomes the filter coefficient, and
- the filter coefficient is set by performing weighted approximation with respect to a desired characteristic using an algorithm adding a restrictive condition so as to pass any frequency point.

36. A sampling rate converter as set forth in claim 35, wherein the filter coefficient is set based on an amplitude characteristic of an equalizer obtained by performing weighted approximation with respect to a desired characteristic using an algorithm adding a restrictive condition so as to pass any frequency point.

37. A sampling rate converter as set forth in claim 35, wherein the low pass filter prevents an aliasing component from occurring and folding from occurring when the sampling frequency of the input is lower than a sampling frequency of the output.

38. A sampling rate converter as set forth in claim 35, wherein the low pass filter prevents an imaging component from occurring and a non-original frequency component from occurring when the sampling frequency of the input is higher than a sampling frequency of the output.

39. A sampling rate converter as set forth in claim 35, wherein the selector includes a counter by which at least a coefficient of linear interpolation, a number of a coefficient set of poly-phases, and a number of input samples are found.

40. A sampling rate converter comprising:
- an up sampler for receiving an input signal at frequency Fsi and for inserting U-1 zero points between sample signals and raising a sampling frequency U-fold to output an output signal at frequency UFsi, coefficients obtained by poly-phase decomposing a predetermined FIR filter and performing convolution processing of input sample signals and a poly-phase filter having a selected coefficient,
- a selector for selecting two points of samples required for an output sample and selecting the coefficient of the corresponding poly-phase filter,
- a linear interpolation block for finding the value at the required position from linear interpolation, and
- a low pass filter providing either low pass filtered signals to the convolution processing unit, or low pass filtering signals output of the linear interpolation block, wherein
- the FIR filter is an FIR filter where an impulse response is expressed by a finite time length, the impulse response becomes the filter coefficient, and a transmission function H(z) is associated with a transmission function Z(z) of the low pass filter, and
- the filter coefficient is set by performing weighted approximation with respect to a desired characteristic in relation to frequency points to be passed and a frequency response of the low pass filter.

41. A sampling rate converter as set forth in claim 40, wherein the filter coefficient is set based on an amplitude characteristic of an equalizer obtained by performing weighted approximation with respect to a desired characteristic in relation to frequency points to be passed and a frequency response of the low pass filter.

42. A sampling rate converter as set forth in claim 40, wherein the weighted approximation is performed with respect to a desired characteristic using a Remex Exchange algorithm passing any frequency point and considering a frequency response of the low pass filter.

43. A sampling rate converter as set forth in claim 40, wherein the low pass filter prevents an aliasing component from occurring and folding from occurring when the sampling frequency of the input is lower than a sampling frequency of the output.

44. A sampling rate converter as set forth in claim 40, wherein the low pass filter prevents an imaging component from occurring and a non-original frequency component from occurring when the sampling frequency of the input is higher than a sampling frequency of the output.

45. A sampling rate converter as set forth in claim 40, wherein the selector includes a counter by which at least a coefficient of linear interpolation, a number of a coefficient set of poly-phases, and a number of input samples are found.

46. A sampling rate conversion method comprising:
a first step of receiving an input signal at frequency Fsi and for inserting U-1 zero points between sample signals and raising the sampling frequency U-fold to output an output signal at frequency UFsi,
a second step of performing predetermined convolution processing with respect to a signal multiplied in its sampling frequency by U by a convolution processing unit including an FIR filter in which an impulse response is expressed by a finite time length, an impulse response becomes the filter coefficient, and a transmission function $H(z)$ is associated with a transmission function $Z(z)$ of a low pass filter,
a third step of selecting two points of samples with respect to the results of processing and finding the value at the required position from linear interpolation, and
providing either low pass filtered sample signals through the low pass filter to the first step, or low pass filtering signals output of the third step through the low pass filter, wherein
the filter coefficient of the FIR filter is calculated by performing weighted approximation with respect to a desired characteristic in relation to a frequency response of the low pass filter.

47. A sampling rate conversion method comprising:
a first step of receiving an input signal at frequency Fsi and for inserting U-1 zero points between sample signals and raising the sampling frequency U-fold to output an output signal at frequency UFsi,
a second step of performing predetermined convolution processing with respect to a signal multiplied in its sampling frequency by U by a convolution processing unit including an FIR filter in which an impulse response is expressed by a finite time length and an impulse response becomes the filter coefficient,
a third step of selecting two points of samples with respect to the results of processing and finding the value at the required position from linear interpolation, and
providing either low pass filtered sample signals to the first step through a low pass filter, or low pass filtering signals output of the third step through the low pass filter, wherein
the filter coefficient of the FIR filter is calculated by performing weighted approximation with respect to a desired characteristic using an algorithm adding a restrictive condition so as to pass any frequency point.

48. A sampling rate conversion method comprising:
a first step of receiving an input signal at frequency Fsi and for inserting U-1 zero points between sample signals and raising the sampling frequency U-fold to output an output signal at frequency UFsi,
a second step of performing predetermined convolution processing with respect to a signal multiplied in its sampling frequency by U by a convolution processing unit including an FIR filter in which an impulse response is expressed by a finite time length, an impulse response becomes the filter coefficient, and a transmission function $H(z)$ is associated with a transmission function $Z(z)$ of a low pass filter,
a third step os selcting two points of samples with respect to the results of procedding and finding the value at the required position from linear interpolation, and
providing either low pass filtered sample signals to the first step through the low pass filter, or low pass filtering signals output of the third step through the low pass filter, wherein
the filter coefficient of the FIR filter is calculated by performing weighted approximation with respect to a desired characteristic in relation to frequency points to be passed and a frequency response of the low pass filter.

49. A sampling rate conversion method comprising:
a first step of performing convolution processing of input sample signals and poly-phase filters decomposed to poly-phases by a plurality of convolution processing units including poly-phase filters obtained by poly-phase decomposing a predetermined FIR filter,
a second step of receiving an input signal at frequency Fsi and for inserting U-1 zero points between output signals of corresponding convolution processing units and raising the sampling frequency U-fold to output an output signal at frequency UFsi,
a third step of adjusting the propagation time of a plurality of signals having sampling frequencies raised U-fold and generating a signal obtained by adding all signals,
a fourth step of selecting two points of samples with respect to the signal by the third step and finding the value at the required position from the linear interpolation, and
providing either low pass filtered sample signals to the first step through a low pass filter, or low pass filtering signals output of the fourth step through the low pass filter, wherein
the FIR filter is a FIR filter where an impulse response is expressed by a finite time length, the impulse response becomes the filter coefficient, and a transmission function $H(z)$ is associated with a transmission function $Z(z)$ of the low pass filter, and
the filter coefficient is calculated by performing weighted approximation with respect to a desired characteristic in relation to a frequency response of the low pass filter.

50. A sampling rate conversion method comprising:
a first step of performing convolution processing of input sample signals and poly-phase filters decomposed to poly-phases by a plurality of convolution processing units including poly-phase filters obtained by poly-phase decomposing a predetermined FIR filter,
a second step of receiving an input signal at frequency Fsi and for inserting U-1 zero points between output signals of corresponding convolution processing units and raising the sampling frequency U-fold to output an output signal at frequency UFsi,
a third step of adjusting the propagation time of a plurality of signals having sampling frequencies raised U-fold and generating a signal obtained by adding all signals,
a fourth step of selecting two points of samples with respect to the signal by the third step and finding the value at the required position from the linear interpolation, and
providing either low pass filtered sample signals to the first step through a low pass filter, or low pass filtering signals output of the fourth step through the low pass filter, wherein the FIR filter is a FIR filter where an impulse response is expressed by a finite time length, and the impulse response becomes the filter coefficient, and the filter coefficient is calculated by performing weighted approximation with respect to a desired characteristic using an algorithm adding a restrictive condition so as to pass any frequency point.

51. A sampling rate conversion method comprising:

a first step of performing convolution processing of input sample signals and poly-phase filters decomposed to poly-phases by a plurality of convolution processing units including poly-phase filters obtained by poly-phase decomposing a predetermined FIR filter, a second step of receiving an input signal at frequency Fsi and for inserting U-1 zero points between output signals of corresponding convolution processing units and raising the sampling frequency U-fold to output an output signal at frequency UFsi, a third step of adjusting the propagation time of a plurality of signals having sampling frequencies raised U-fold and generating a signal obtained by adding all signals, a fourth step of selecting two points of samples with respect to the signal by the third step and finding the value at the required position from the linear interpolation, and providing either low pass filtered sample signals to the first step through a low pass filter, or low pass filtering signals output of the fourth step through the low pass filter, wherein the FIR filter is a FIR filter where an impulse response is expressed by a finite time length, the impulse response becomes the filter coefficient, and a transmission function H(z) is associated with a transmission function Z(z) of the low pass filter, and the filter coefficient is calculated by performing weighted approximation with respect to a desired characteristic in relation to a frequency points to be passed and a frequency response of the low pass filter.

52. A sampling rate conversion method comprising:

receiving an input signal at frequency Fsi and inserting U-1 zero points between sample signals and raising a sampling frequency U-fold to output an output signal at frequency UFsi, selcting two points of samples required for an output sample and selecting a coefficient of a corresponding poly-phase filter;

performing convolution processing of input sample signals and the poly-phase filter having the selected coefficient by a convolution processing unit including poly-phase filters obtained by poly-phase decomposing a predetermined FIR filter and able to set different filter coefficients, and providing either low pass filtered sample signals to the first step through a low pass filter, or low pass filtering signals output of the second step through the low pass filter, wherein the FIR filter is a FIR filter where an impulse response is expressed by a finite time length, the impulse response becomes the filter coefficient, and a transmission function H(z) is associated with a transmission function Z(z) of the low pass filter, and the filter coefficient is calculated by performing the weighted approximation with respect to a desired characteristic in relation to a frequency response of the low pass filter.

53. A sampling rate conversion method comprising:

receiving an input signal at frequency Fsi and inserting U-1 zero points between sample signals and raising a sampling frequency U-fold to output an output signal at frequency UFsi, selecting two points of samples required for an output sample and selecting a coefficient of a corresponding poly-phase filter;

performing convolution processing of input sample signals and the poly-phase filter having the selected coefficient by a convolution processing unit including poly-phase filters obtained by poly-phase decomposing a predetermined FIR filter and able to set different filter coefficients, and providing either low pass filtered sample signals to the first step through a low pass filter, or low pass filtering signals output of the second step through the low pass filter, wherein the FIR filter is a FIR filter where an impulse response is expressed by a finite time length, and the impulse response becomes the filter coefficient, and the filter coefficient is calculated by performing the weighted approximation with respect to a desired characteristic using an algorithm adding a restrictive condition so as to pass any frequency point.

54. A sampling rate conversion method comprising:

receiving an input signal at frequency Fsi and inserting U-1 zero points between frequency UFsi, selecting two points of samples required for an output sample and selecting a coefficient of a corresponding poly-phase filter;

performing convolution processing of input sample signals and the poly-phase filter having the selected coefficient by a convolution processing unit including poly-phase filters obtained by poly-phase decomposing a predetermined FIR filter and able to set different filter coefficients, and providing either low pass filtered sample signals to the first step through a low pass filter, or low pass filtering signals output of the second step through the low pass filter, wherein the FIR filter is a FIR filter where an impulse response is expressed by a finite time length, the impulse response becomes the filter coefficient, and a transmission function H(z) is associated with a transmission function Z(z) of the low pass filter, and the filter coefficient is calculated by performing the weighted approximation with respect to a desired characteristic in relation to a frequency points to be passed and a frequency response of the low pass filter.

55. An audio apparatus including a sampling rate converter, wherein the sampling rate converter comprises:

an up sampler for receiving an input signal at frequency Fsi and for inserting U-1 zero points between sample signals and raising a sampling frequency U-fold to output an output signal at frequency UFsi, a convolution processing unit including an FIR filter and performing predetermined convolution processing with respect to the output signal of the up sampler, a linear interpolation block for selecting two points of samples with respect to the results of processing of the convolution processing unit and finding a value at a required position from linear interpolation, and a low pass filter providing either low pass filtered sample signals to the up sampler, or low pass filtering signals output of the linear interpolation block, wherein the FIR filter of the convolution processing unit is an FIR filter where an impulse response is expressed by a finite time length, the impulse response becomes the filter coefficient, and a transmission function H(z) is associated with a transmission function Z(z) of the low pass filter, and the filter coefficient is set by performing weighted approximation with respect to a desired characteristic in relation to a frequency to be passed and/or a frequency response of the low pass filter.

56. An audio apparatus including a sampling rate converter, wherein the sampling rate converter comprises:
- a plurality of convolution processing units including pre-phase filters obtained by poly-phase decomposing a predetermined FIR filter and performing convolution processing of input sample signals and poly-phase filters decomposed to poly-phases,
- a plurality of up samplers for receiving input signals at frequency Fsi and for inserting U-1 zero points between output signals of corresponding convolution processing units and raising the sampling frequency U-fold to output output signals at frequency UFsi,
- an adding means for generating a signal after adding all signals by adjusting a propagation time of the output signals of the plurality of up samplers,
- a linear interpolation block for selecting two points of samples with respect to the signal by the adding means and finding the value at the required position from linear interpolation, and
- a low pass filter providing either low pass filtered sample signals to the plurality of up samplers, or low pass filtering signals output of the linear interpolation block, wherein
- the FIR filter is an FIR filter where an impulse response is expressed by a finite time length, an impulse response becomes the filter coefficient, and a transmission function H(z) is associated with a transmission function Z(z) of the low pass filter, and
- the filter coefficient is set by performing the weighted approximation with respect to a desired characteristic in relation to a frequency to be passed and/or a frequency response of the low pass filter.

57. An audio apparatus including a sampling rate converter, wherein the sampling rate converter comprises:
- an up sampler for receiving an input signal at frequency Fsi and for inserting U-1 zero points between sample signals and raising a sampling frequency U-fold to output an output signal at frequency UFsi,
- a convolution processing unit including poly-phase filters able to set different filter coefficients obtained by poly-phase decomposing a predetermined FIR filter and performing convolution processing of input sample signals and a poly-phase filter having a selected coefficient,
- a selector for selecting two points of samples required for an output sample and selecting the coefficient of the corresponding poly-phase filter, and
- a low pass filter providing either low pass filtered signals to the convolution processing unit, or low pass filtering signals output of the selector, wherein
- the FIR filter is an FIR filter where an impulse response is expressed by a finite time length, the impulse response becomes the filter coefficient, and a transmission function H(z) is associated with a transmission function Z(z) of the low pass filter, and
- the filter coefficient is set by performing weighted approximation with respect to a desired characteristic in relation to a frequency to be passed and/or a frequency response of the low pass filter.

\* \* \* \* \*